(12) United States Patent
Winkel et al.

(10) Patent No.: US 11,264,581 B2
(45) Date of Patent: Mar. 1, 2022

(54) FLEXIBLE SUBSTRATE MATERIAL AND METHOD OF FABRICATING AN ELECTRONIC THIN FILM DEVICE

(71) Applicant: EIGHT19 LIMITED, Cambridge (GB)

(72) Inventors: Jurjen Frederik Winkel, Ely (GB); Michael Niggemann, Cologne (DE)

(73) Assignee: EIGHT19 LIMITED, Cambridge (GB)

( * ) Notice: Subject to any disclaimer, the term of this patent is extended or adjusted under 35 U.S.C. 154(b) by 172 days.

(21) Appl. No.: 15/327,396

(22) PCT Filed: Jul. 23, 2015

(86) PCT No.: PCT/GB2015/052141
§ 371 (c)(1),
(2) Date: Jan. 19, 2017

(87) PCT Pub. No.: WO2016/012802
PCT Pub. Date: Jan. 28, 2016

(65) Prior Publication Data
US 2017/0170418 A1 Jun. 15, 2017

(30) Foreign Application Priority Data
Jul. 23, 2014 (GB) ..................... 1413040

(51) Int. Cl.
*H01L 51/44* (2006.01)
*H01L 51/00* (2006.01)
*H01L 31/0236* (2006.01)

(52) U.S. Cl.
CPC ...... *H01L 51/448* (2013.01); *H01L 31/02366* (2013.01); *H01L 51/0097* (2013.01);
(Continued)

(58) Field of Classification Search
None
See application file for complete search history.

(56) References Cited

U.S. PATENT DOCUMENTS

| 2,336,754 | A | 2/1941 | Schelhammer et al. |
| 6,080,928 | A | 6/2000 | Nakagawa |

(Continued)

FOREIGN PATENT DOCUMENTS

| CN | 103035779 | 4/2013 |
| DE | 202010017703 | 6/2012 |

(Continued)

OTHER PUBLICATIONS

Combined Search and Examination Report; Application No. GB1413040.5; dated Jan. 20, 2015.

(Continued)

*Primary Examiner* — Shannon M Gardner
(74) *Attorney, Agent, or Firm* — Hartman Global IP Law; Gary M. Hartman; Domenica N. S. Hartman

(57) ABSTRACT

A flexible substrate material having opposed front and back sides and extending in an X-Y plane, the front side being provided with a first electrode layer and further provided with at least one thin film to form at least one thin film device stack; the thin film device stack extending from the X-Y plane in a Z direction perpendicular to the X-Y plane to a distance T; the substrate material having at least one protective structure applied to at least one of the substrate material sides, the first electrode layer and the at least one thin film; the at least one protective structure extending in the Z direction to a distance S from the X-Y plane, the distance S being greater than the distance T.

14 Claims, 31 Drawing Sheets

(52) U.S. Cl.
CPC ............ *H01L 51/44* (2013.01); *H01L 51/445* (2013.01); *Y02E 10/549* (2013.01)

(56) References Cited

U.S. PATENT DOCUMENTS 7,915,518 B2 * 3/2011 Yuuki ............... B32B 17/10036
136/243
2011/0284889 A1 11/2011 Takeda et al.

FOREIGN PATENT DOCUMENTS

| | | |
|---|---|---|
| DE | 102011106390 | 1/2013 |
| EP | 0763858 | 3/1997 |
| JP | 2011175940 | 9/2011 |
| JP | 2013065708 | 4/2013 |
| JP | 2014189122 | 10/2014 |
| WO | 2008093108 | 8/2008 |
| WO | 2009086161 | 7/2009 |
| WO | 2011082177 | 7/2011 |
| WO | 2012003099 | 1/2012 |
| WO | 2013180722 | 12/2013 |

OTHER PUBLICATIONS

International Search Report and Written Opinion; PCT/GB15/052141, dated Sep. 28, 2015.
First Chinese Office Action dated Apr. 4, 2018.

* cited by examiner

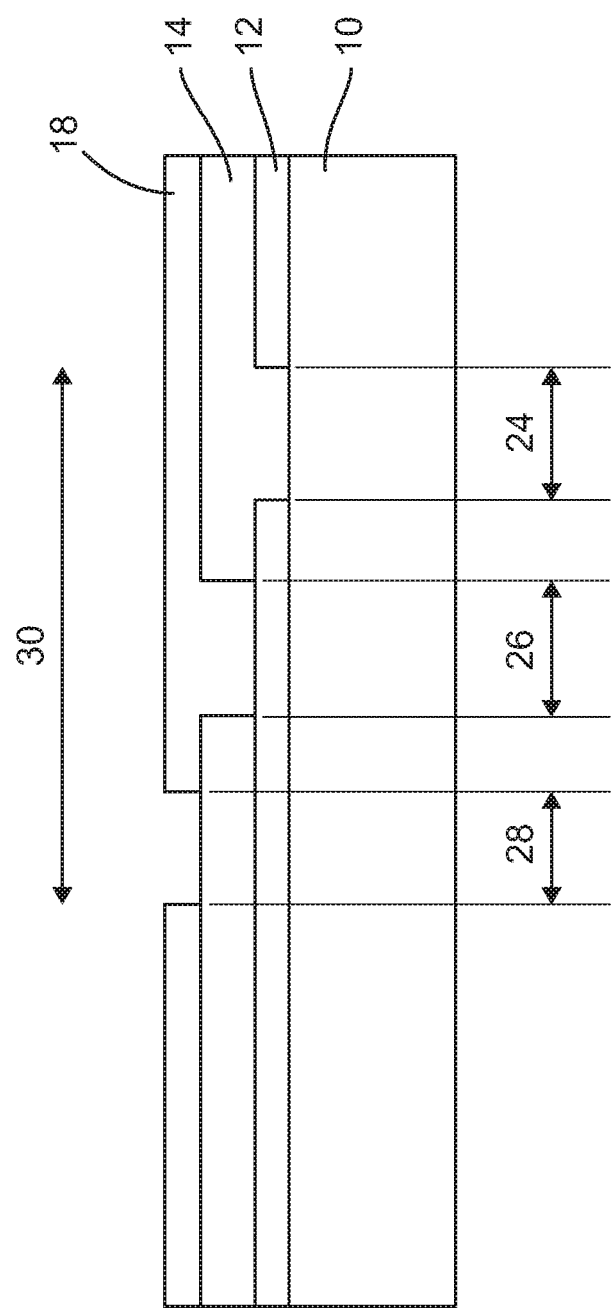

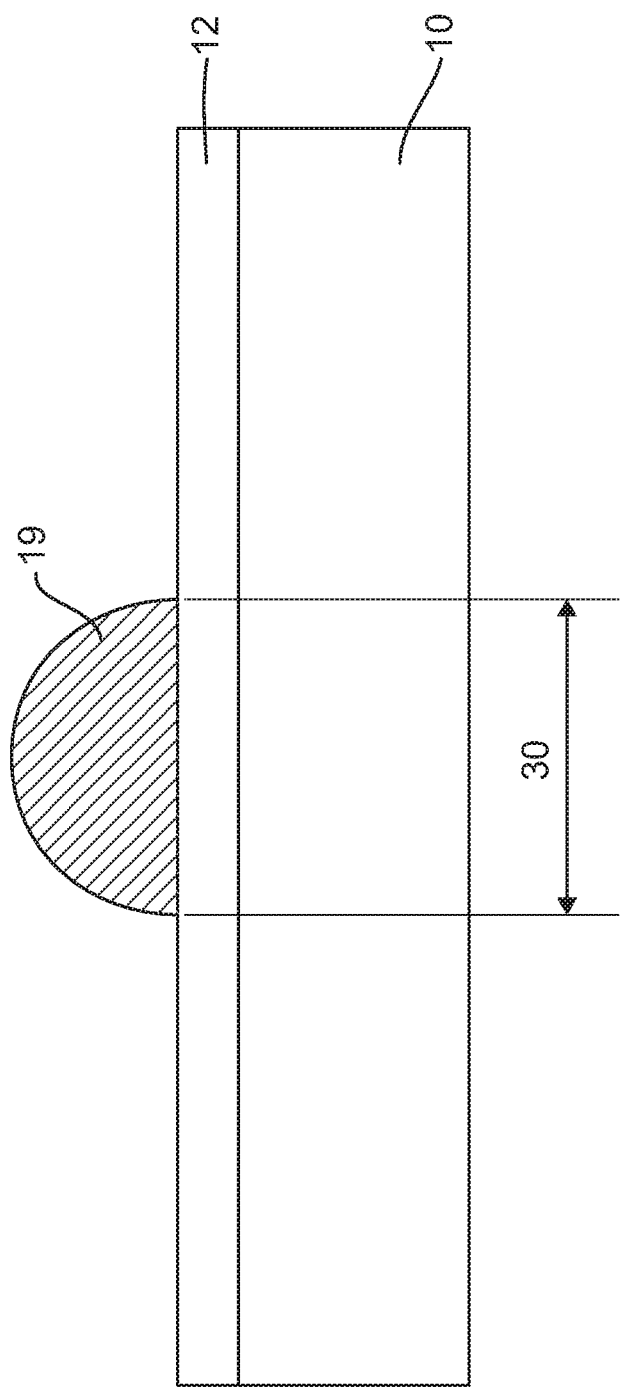
FIG. A2

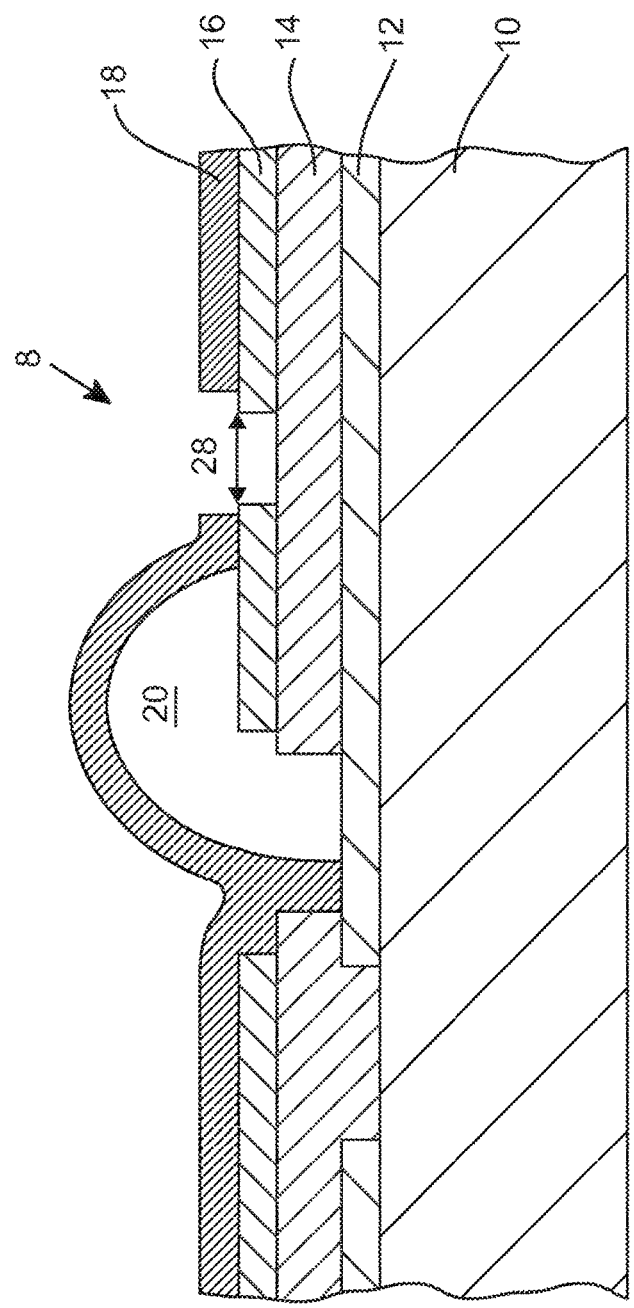

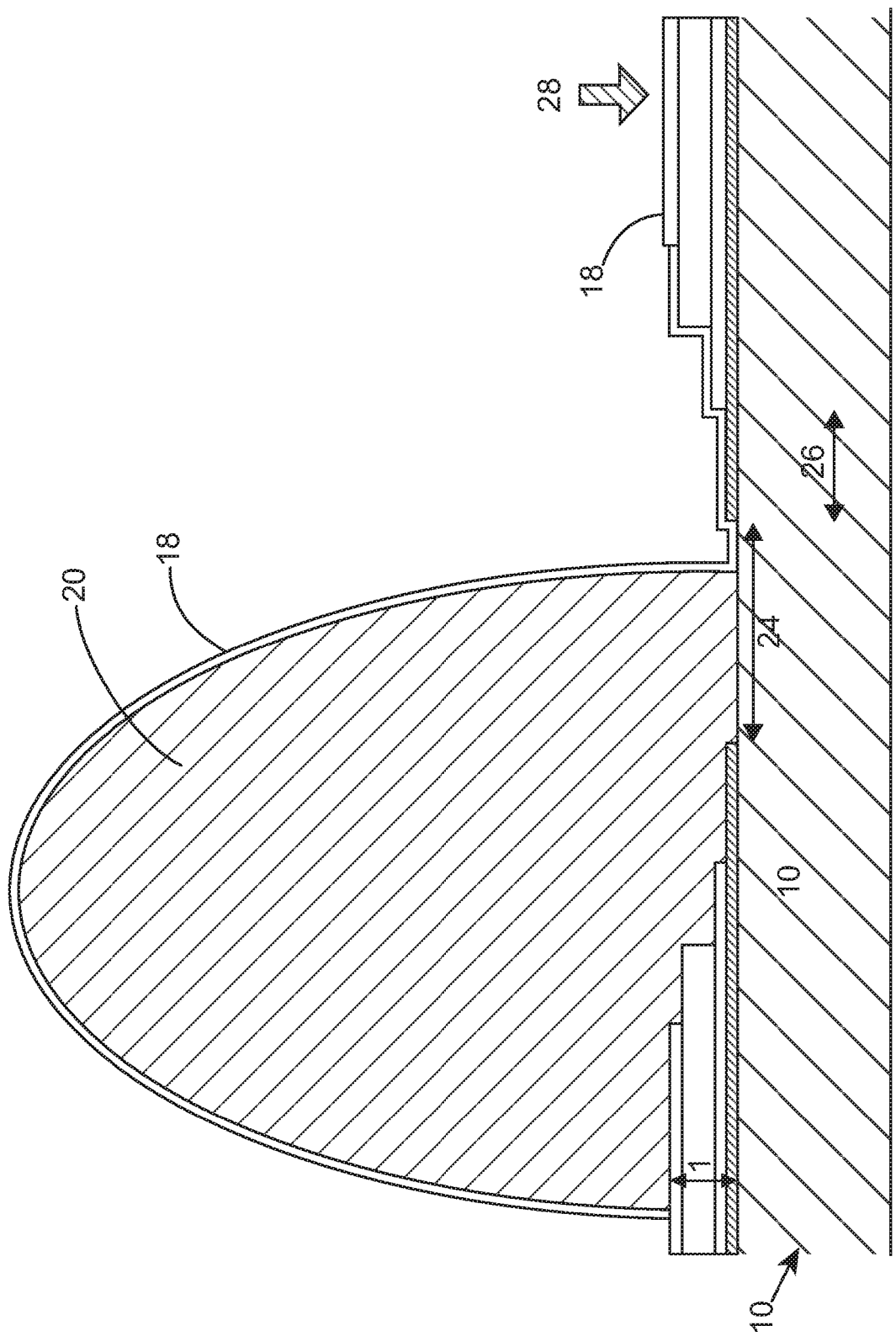

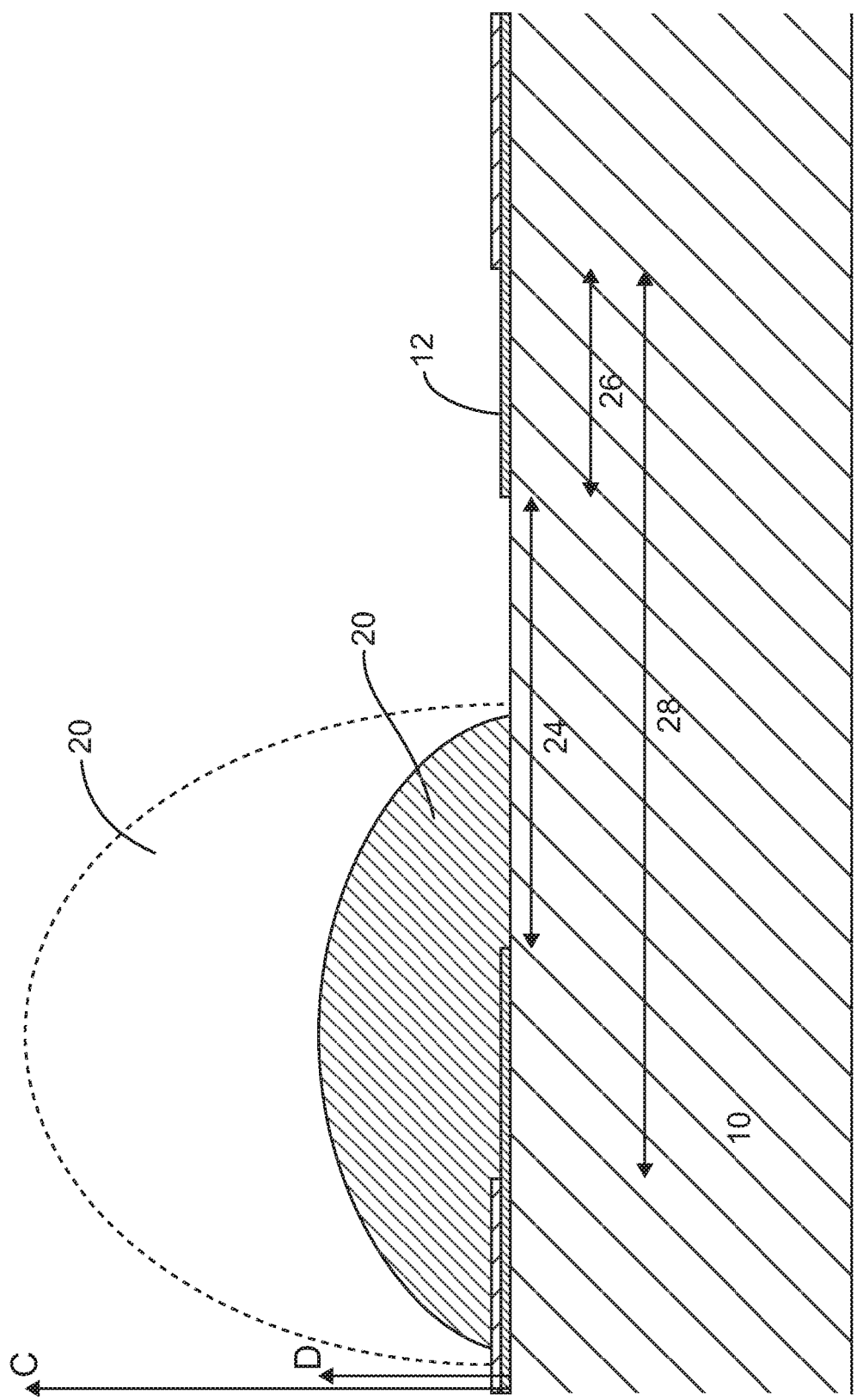

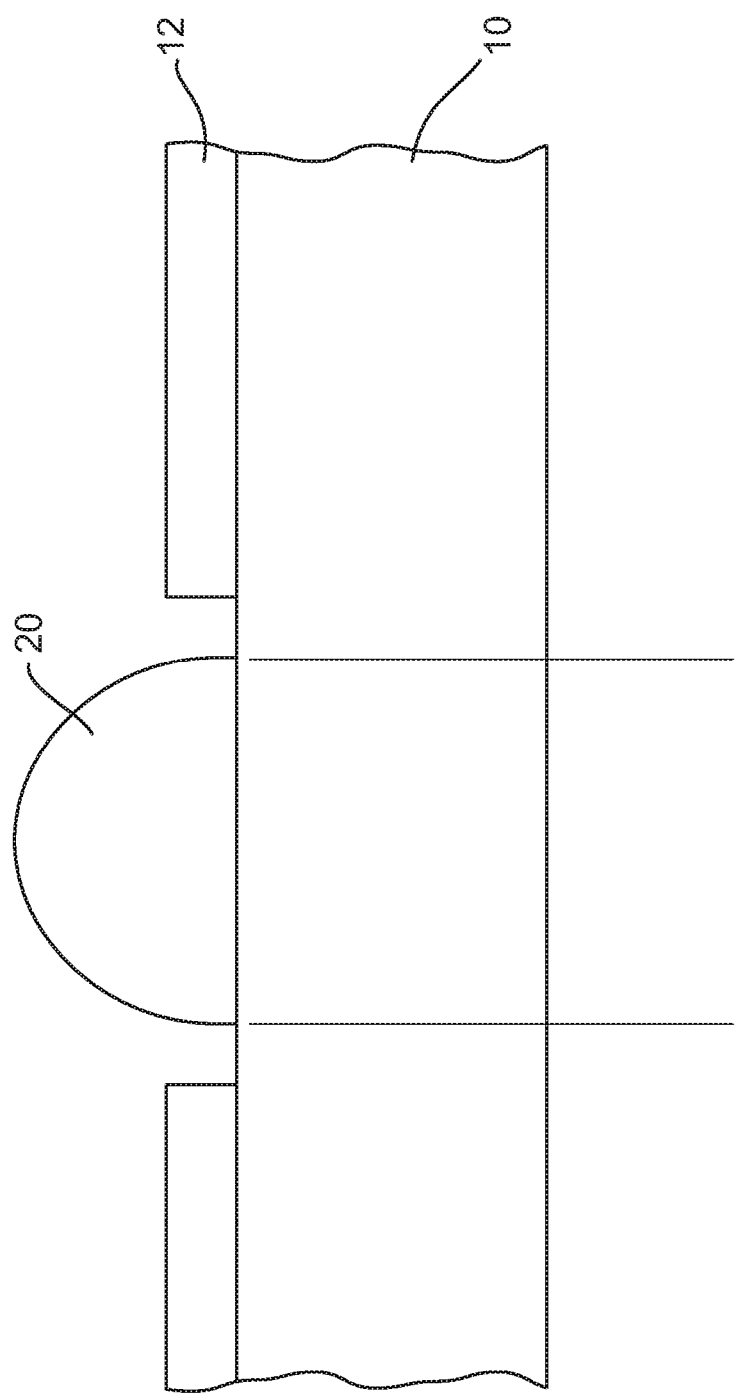

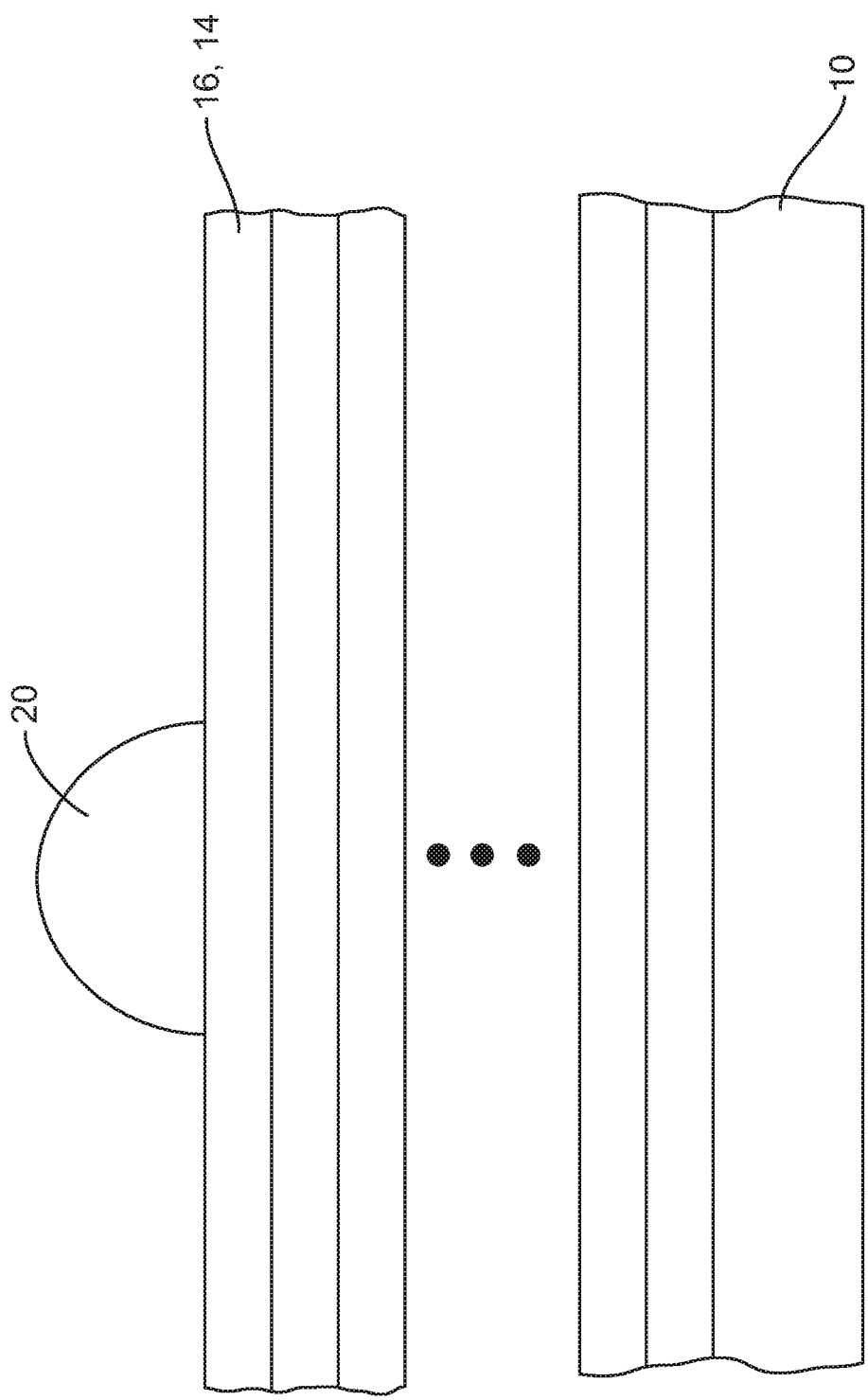

FLEXIBLE SUBSTRATE MATERIAL AND METHOD OF FABRICATING AN ELECTRONIC THIN FILM DEVICE

This invention relates to a flexible substrate material for use in fabricating electronic thin film devices such as photovoltaic modules and light emitting diodes. In particular, this invention relates to a flexible substrate material for use in a method of fabricating an electronic thin film device, in particular an organic electronic thin film device, using a roll-to-roll process.

Organic electronic thin film devices such as organic photovoltaic modules and organic light emitting diodes comprise stacks of thin film organic layers and inorganic layers ranging from a few to several hundreds of nanometers in thickness. Roll-to-Roll manufacturing is regarded as the most economical production technology and a roll typically comprises a substrate coatable by various functional layers during processing. Such a substrate carrying one or more such coated functional layers is commonly referred to as a "web" in the art. A challenge is the handling of the web during roll-to-roll processing without damaging any built-up layers, because damage to any built-up layers will result in a reduction in device performance and yield.

The most common defects in roll-to-roll manufacturing are caused by contact of the coated layers with rollers during web transport, which is also known as face-side contact with rollers. Contact of the coated side with the back side of the web occurs after rewinding and any free particles upon the substrate back side can also cause indentation into and damage to the layers during the wind-up process. Such damage can result in a reduction of device performance via 'pick-off' defects where adhesion of embedded particles to other surfaces causes layer damage, or embedded particles in thin film layers which can cause short circuits. Scratches caused by relative movement or slippage against rollers or during wind up or unwind of the web can further reduce device performance. "Peel-off" can be a result of excessive adhesion to roller surfaces, or the back side of the web, relative to the adhesion to the coated side, and can be exacerbated by insufficient drying.

It is often envisioned to build up the complete device structure using roll-to-roll (R2R) deposition processes. In an ideal scenario all layers are deposited in sequence on one R2R line. In this way unwinding and re-winding of the web prior to the final coating can be avoided. If face side contact is avoided in this process, a low defect rate is expected. Such an integrated machine would require processing at the same speed (unless expensive magazines, still with a limited capacity are utilized). However, different processes have different optimum speeds and speed constraints. Exemplar roll-to-roll processes that are of interest are: ambient coating wet coating techniques like gravure coating, slot-die coating, gravure printing, ink-jet printing, screen printing, flexo-printing and spray coating and vacuum coating techniques, like thermal or electron beam evaporation and sputter coating. Often the process speed for wet film deposition is limited by the time needed to dry the deposited layers and the length of the dryers. Vacuum deposition processes are often optimized for high deposition rates and therefore high speeds. A bottom electrode, for example is typically supplied already deposited on the web (although fully wet coated and/or printed electrode options exist).

Processing on separate machines requires rewinding and un-winding of the web at every transition to a new process. Standard type machines often do not provide a web path that avoids contact between coated side and roller surfaces.

The obvious advantages of sequential processing on several machines are the processing at optimum speed for each process and the utilization of available machine resources.

In order to reduce the occurrence of defects in such roll-to-roll processes, prior art methods have adopted a number of complementary strategies. These include an improvement in the cleanliness of the production environment; a reduction in and/or avoiding face side contact with rollers by using air turner bars; modification of the web edge using edge knurls; altering the surface properties of the rollers by for example using a low adhesion roller; and by significantly modifying material properties, such as the film thickness, beyond what might be considered an optimum in terms of performance and material cost to improve their robustness.

In summary, state of the art strategies to reduce and avoid generation of defects by face side contact rely on either (a) the modification of material properties, which can negatively affect electrical properties of the device; (b) on the modification of the roll-to-roll machine, which requires considerable cost, time and reduces the versatility of the machine for different web dimensions or the use of third party equipment; and (c) on the modification of the web edge, which is not scalable because it is limited to a certain web width.

Accordingly there is a need for an improved solution which minimizes the occurrence or effect of defects on electrical performance of a device that may result from face side contact of the web during transport over rollers in a machine as well as via winding and rewinding. The present invention therefore seeks to provide a method of fabricating an electronic thin film device in a roll-to-roll process and a flexible substrate material, which overcome, or at least reduce some of the above-mentioned problems of the prior art.

According to a first aspect of the invention, there is provided a flexible substrate material having opposed front and back sides and extending in an X-Y plane, the front side being provided with a first electrode layer and further provided with at least one thin film to form at least one thin film device stack; the thin film device stack extending from the X-Y plane in a Z direction perpendicular to the X-Y plane to a distance T; the substrate material having at least one protective structure applied to at least one of the substrate material sides, the first electrode layer and the at least one thin film; the at least one protective structure extending in the Z direction to a distance S from the X-Y plane, the distance S being greater than the distance T.

Advantageously, the flexible substrate material may have a plurality of discrete thin film device stacks; neighbouring thin film device stacks having a zone of electrical interconnection between them, and wherein the at least one protective structure is located at least partially in a zone of electrical interconnection. The positioning of the at least one protective structure at least partially in a zone of electrical interconnection reduces additional losses in device performance because the zones of electrical interconnection are inactive regions with no or reduced carrier generation (solar device) or photon generation (LED) or charge storage (battery).

The flexible substrate material may further have a top electrode deposited on top of the thin film device stacks; wherein the thin film device stacks are arranged to be electrically series connected and each zone of electrical interconnection comprises a region for depositing a conductive material for providing an interconnection between the top electrode of a first film stack and a first electrode of a neighbouring thin film stack. This arrangement creates monolithic series interconnected structures required to achieve useful working voltages and current in the case of photovoltaic modules.

Advantageously, the at least one protective structure may be located over a portion of the first electrode and under a portion of the top electrode. Without the presence of the protective structure covering a portion of the first electrode, the thin film device stacks would experience a short circuit between their top electrodes and first electrodes.

Advantageously, two protective structures, each formed of different materials, may be deposited in the zone of electrical interconnection of the flexible substrate material. More advantageously, one of the structures may comprise a liquid, a grease or a wax. Greases or waxes have the properties of preventing the deposition of metal electrodes or even other materials over their surface.

The thin film device stacks of the flexible substrate material may alternatively or additionally be arranged to be electrically parallel connected and each zone of electrical interconnection comprises a gap between neighbouring thin film device stacks and at least some of the zones of electrical interconnection contain a current conducting material that forms an interconnection between a first electrode and an output terminal. This current conducting material collects/delivers the current from/to smaller areas of the first electrode and therefore allows an efficient extraction/delivery with the trade-off of small shadowing losses by the current conducting material.

Advantageously the at least one protective structure may be deposited over at least part of the current conducting material. More advantageously, the at least one protective structure is formed from a current conducting material.

The ratio in height of the protective part (typically a dielectric) and the conducting part may vary such that the conducting part makes the main contribution to the height, whereas the purpose of the relatively thin covering of protective dielectric in this case provides electrical isolation.

Advantageously, the at least one protective structure may be deposited as a continuous bead of material. Alternatively or additionally, the at least one protective structure may be deposited in discrete units or as an intermittent bead of material. In order to provide a protective effect, the dimensions and locations of the protective structures in the plane (X-Y positioning) are important. The protective effect is achieved by creating a gap or a region of reduced pressure or preferably with no contact between the thin film device stack (the area in between the protective structures) and the surface against which the flexible substrate material is pressed against (for example, a machine roller in a roll-to-roll process).

More advantageously, the ratio of the distance S to the distance T is at least 10:1.

According to another embodiment of the first aspect of the invention, the at least one protective structure may be applied to the back side of the flexible substrate material. Advantageously, the at least one protective structure may be applied to the flexible substrate material so as to at least partially underlie a zone of electrical interconnection on the front side of the flexible substrate material. The purpose of the protective structures is to protect the active regions of the thin film device stacks when the flexible substrate material is rolled up. By locating the protective structures on the non-coated surface of the substrate material (the back side) so that they engage with the zone of electrical interconnection on the surface which has the thin film coatings (the front side), it is possible to avoid or at least reduce defects in areas critical for electrical shunts.

According to a second aspect of the invention, there is provided a method of fabricating an electronic thin film device in a roll-to-roll process, the method comprising providing a flexible substrate material having opposed front and back sides with a first electrode layer on the front side; depositing on the first electrode layer at least one thin film to form at least two thin film device stacks; providing a zone of electrical interconnection between neighbouring thin film device stacks; and depositing at least one protective structure at least partially in a zone of electrical interconnection.

In the method according to the second aspect, the flexible substrate material extends in an X-Y plane and depositing the at least one thin film results in thin film device stacks extending from the X-Y plane in a Z direction perpendicular to the X-Y plane to a distance T; and depositing the at least one protective structure results in at least one protective structure extending in the Z direction to a distance S from the X-Y plane, the distance S being greater than the distance T.

According to a further aspect of the present invention, there is provided a substrate material extending in an X-Y plane and coated with a first electrode layer and further coated with one or more thin films to form a thin film device stack; the thin film device stack extending from the X-Y plane in a Z direction perpendicular to the X-Y plane to a distance T; at least one spacer element extending from the X-Y plane in a Z direction, the spacer element extending either directly from the substrate surface or being deposited on the first electrode layer or any of the thin films forming the thin film device stack; the spacer element, where present, extending in a Z direction to a distance S from the X-Y plane, the distance S being greater than the distance T.

The present invention provides a thin film electronic device architecture with spacer structures that protect it from damage. The protection of the thin film electronic device can be provided for various stages of its production. For example, protection can be afforded during transport of the coated film in a roll-to-roll machine; during the unwind and rewind process of the film; in the wound up state of the web; and during any lamination processes.

In order to provide the protective effect, the dimensions and locations of the spacer structures in the plane (X-Y positioning) as well as materials are important. It is also important that the thickness of spacer in the Z direction is greater than the thickness of the thin film stack (Z-orientation).

According to another aspect of the present invention there is provided a substrate material having a plurality of discrete thin film device stacks; the thin film device stacks having a zone of electrical interconnection between neighbouring thin film device stacks, and where the spacer structure is located at least partially in the zone of electrical interconnection.

According to another aspect of the present invention there is provided a substrate material further having a top electrode deposited on top of the thin film device stack; the thin film stacks are arranged to be electrically series connected and the zone of electrical interconnection comprises a gap for depositing a conductive material for providing an interconnection between top and first electrodes of neighbouring thin film stacks.

The spacer structures preferably comprise dielectric structures primarily located in the so-called zone of electrical interconnection between two neighbouring thin film element stacks, which may also be referred to as cell elements.

The high utilization of the area for light absorption in the case of photovoltaic modules and light emission for light emitting films is important for high performance and homogenous appearance. The serial interconnection of segments of thin film devices is called monolithic interconnection. This is achieved by appropriate patterning of the respective films as illustrated in Fig. A1, which is a schematic drawing of the cross section through the serial interconnection of adjacent solar cell elements. For simplification, only the bottom electrode, the photoactive layer and the top electrode are shown.

Preferably the present invention provides a substrate material wherein the zone of electrical interconnection is provided by one or more of patterning features P1, P2 and P3; wherein P1 provides an electrical separation of a first electrode between neighbouring thin film device stacks, P2 provides a gap for electrical interconnection between a top and first electrode of neighbouring thin film stacks, and P3 provides an electrical separation of the top electrode.

Preferably the present invention provides a substrate material wherein the thin film element stacks are series connected and the zone of electrical interconnection comprises a deposited conductive material providing an interconnection between top and first electrodes of neighbouring thin film element stacks.

The zone in which the interconnection of adjacent cell elements is carried out is characterized by three patterning features or zones termed P1, P2 and P3, denoted by reference numerals 24, 26 and 28, respectively, in Figure A1. Typically, P1 provides the separation of the bottom electrode, P2 provides the electrical interconnection between top and bottom electrodes of adjacent cells and P3 provides the separation of the top electrode. P1 and P2 expose the substrate or underlying barriers and the bottom electrode respectively.

In another embodiment of the present invention the zone of interconnection is defined as the area between the outer boundaries of the P1 and P3 patterning features.

In another embodiment of the present invention the spacer structure is located over a portion of the first electrode and where present, under a portion of the top electrode.

In one embodiment described herein, the thin film layers can be built up by coating in sequence and then channels or patterns are created through the coated layers to expose layers and form the zone of electrical interconnection. The spacer structure can be partially deposited in that zone. In this manner, the zones of electrical interconnection may be created around known P1, P2, and P3 exposed surfaces.

P1 and P2 pattern features can be formed using a laser scribing process that creates monolithic series interconnected structures required to achieve useful working voltages and current in the case of photovoltaic modules. Such a patterning allows the division of large solar cell modules into an array of smaller series interconnected cells on one monolithic substrate. A P3 patterning feature provides the separation of the top electrode.

In another embodiment of the present invention, there is provided a substrate material wherein the thin film stacks are series connected and the zone of electrical interconnection comprises a deposited conductive material providing an interconnection between top and first electrodes of neighbouring thin film stacks.

In another embodiment of the present invention, there are two structures, each formed of different materials deposited in the zone of interconnection, one of said structures being a spacer structure. In another more specific embodiment of the present invention where there are two structures, one of which is a spacer, the other one of the structures comprises a liquid, a grease or a wax.

Preferably, an alternative, or potentially additional, approach to the above described series interconnection is the parallel interconnection approach. This is effected by the provision of current collecting means more conveniently referred to as bus bars. These bus bars collect/deliver the current from/to smaller areas of a transparent electrode and therefore allow an efficient extraction/delivery with the trade-off of small shadowing losses by the bus bars. FIG. A2 is a schematic drawing of the cross section of a parallel connection. The conductive grid line collects current from the bottom electrode, as smaller areas are connected effectively in parallel (although the small areas are not physically separated electrode structures). The device compartments separated by the conductive grid lines are therefore effectively connected in parallel. The zone of interconnection is defined by the area covered by the current collecting feature.

In another embodiment of the present invention, there is provided a substrate material wherein the thin film stacks are arranged to be parallel connected and the zone of electrical interconnection comprises a gap between neighbouring thin film stacks for receiving therein a current conducting spacer element which forms an interconnection between a first electrode and an output terminal.

Preferably, for device stacks connected in parallel in particular, the present invention provides a substrate material wherein the zone of electrical interconnection is defined as the interface area between the conducting material and the transparent electrode.

According to another aspect of the present invention, the conducting material is a conductive grid line or bus bar.

In patent application WO 2012/004589 a method of patterning an article is shown using a thread as an alternative to a laser scribing process.

According to another aspect of the present invention, there is a substrate material comprising along an X-Y plane spaced thin film stacks having one or more thin film layers, the thin film stacks having a zone of electrical interconnection between neighbouring thin film stacks, where a spacer element is located at least partially in the zone of electrical interconnection.

In another embodiment described herein, the thin film layers can be built up by printing and the channels or patterns are created as a result of the printing architecture. In this example a preferred form of printing is ink jet printing.

It is an advantage of the present invention that where the desired top electrode is a vacuum deposited metal electrode it is created after the spacer structure is deposited. Prior to deposition of the spacer structure, the thin film element stack may comprise a deposited top interface layer, which may additionally be a conductive layer. An example of such a combined interface and conductive layer is PEDOT:PSS (poly(3,4-ethylenedioxythiophene) poly(styrenesulfonate).

According to another aspect of the present invention, a method of fabricating a thin film electronic device in a roll-to-roll process comprises providing a substrate; depositing one or more thin film layers to create thin film device stacks; providing a zone of electrical interconnection between thin film device stacks; and depositing a spacer element at least partially in the zone of electrical interconnection between thin film device stacks.

The top electrode can be formed by various materials, or deposited by different methods. Commonly used electrodes are screen or gravure printed silver pastes. Thinner electrodes can be deposited from nanoparticle inks. Deposition methods are gravure, flex or ink-jet printing. Also spray coating has been successfully demonstrated. Vacuum processes can also be employed for the deposition of the top electrode as well as for interface materials. Exemplar vacuum deposition processes are thermal evaporation, sputter coating, CVD (Chemical Vapour Deposition), etc. Often, these above listed processes for electrode deposition are carried out at speeds different from the coating speeds for organic functional layers.

In practical circumstances, the step of depositing a top metal electrode occurs after a step of winding the web into a roll and transporting the web to an apparatus suitable for the deposition of a top metal electrode. Also, preferably, when the spacer structure is deposited, the thin film element stacks comprise thin film layers comprising an active layer such as a photovoltaic (PV) layer or layers forming LEDs or OLEDs. The spacer structure preferably has a z-axis height greater than all thin film layers of the neighbouring thin film device stacks. In the case of a photovoltaic device, the current generating layer may comprise an organic semiconductor layer. In the art, where the thin film element stacks comprise at least one organic semiconductor layer as part of an active layer, then the resultant device is termed an organic semiconductor device notwithstanding the presence of inorganic layers.

The present invention provides an architecture for a web incorporating a spacer structure. In the case of a thin film solar module for example the module can comprise Z-axis spacer structures with out of plane dimensions larger than 1 micrometer.

According to another aspect of the present invention there is provided a substrate material wherein the spacer element is deposited on the first electrode.

According to another aspect of the present invention there is provided a substrate material, wherein the spacer element is deposited over at least a part of the conducting material.

The present invention provides a thin film electronic device architecture with inbuilt spacer structures that protect it from damage. The protective effect is achieved by creating a gap or a region of reduced pressure or preferably with no contact between the thin film (the area in between the spacer structures) and the surface against which the web is pressed against (for example, machine roller or back side of web during wind up and in wound up state). This would reduce the likelihood of damage caused by indentation, scratches, pick-off caused by particles entrapped between thin film structure and opposing surfaces, particles embedded in the thin film stack, rough surfaces or strong adhesion between the coated thin film(s) and the surface.

In another embodiment of the present invention there is provided a substrate material, wherein the spacer element is located between thin films and in an inactive region of a thin film device stack According to another aspect of the present invention there is provided a substrate material, wherein the spacer element is deposited on the conducting material and thin film layers in an inactive region of the thin film element stack.

According to another aspect of the present invention there is provided a substrate material in which the spacer element is deposited as a continuous bead of material.

Alternatively, a substrate material comprises a spacer element which is a current conducting material.

Alternatively, a substrate material comprises a spacer element that is deposited as discrete units in the shape of dots or similar shapes or as an intermittent bead of material.

Two types of interconnection concepts are known to be of relevance for optoelectronic thin film devices, the series interconnection and parallel interconnection. The interconnection zones for the series and parallel interconnection are defined as:

For the series interconnection of cell elements, the zone of interconnection is defined by the outer boundaries of the P1 and the P3 separation features, that is the area between the left hand edge of the P3 separation feature 28 and the right hand edge of the P1 separation feature 24 shown in Figure A1.

For parallel interconnection, the zone/area of interconnection is defined as the area which is covered by the current collecting lines, bus-bars or grid, that is the zone of interconnect 30 covered by the conductive grid 19 shown in Figure A2.

The spacer structures are preferably incorporated in the zone of the electrical interconnection between two neighbouring cell elements. This zone is characterized by three patterning features or zones termed P1, P2 and P3.

Typically, P1 provides the separation of the bottom electrode, P2 provides the electrical interconnection between top and bottom electrode of adjacent cells and P3 provides the separation of the top electrode. P1 and P2 expose the substrate or underlying barrier layers and the bottom electrode respectively. Zones P1 and P2 do not contribute to the generation of electrical current in a photovoltaic cell or the emission of light in a light emitting device and are therefore redundant space making the zones an advantageous selection of area within which to deposit the spacer structure. The zones P1 and P2 provide surface interfaces with good adhesion for the spacer structure. The spacer structure can fully or partially cover the P1 or P2 features or zones and also adjacent areas.

The dimensions of the spacer structures are selected taking the following properties into account: the size and distribution of particle present during processing; distance between adjacent cell elements located in the zone of the cell interconnection—the optimal distance is largely determined by the conductivity of the transparent electrode. Larger cell spacing will result in greater bowing of the web under tension and therefore larger z-axis structure heights are required to avoid damage. Typical values for the distance between interconnections are in the order of 5 to 15 mm. Smaller distances can be found where higher voltages are required and larger distances of several centimeters can be found for highly conductive electrodes (for instance those facilitated by grid structures) or low light intensity applications. Other properties of importance when considering spacer dimension requirements include the thickness and elastic modulus of the base material or composite, the web tension during roll-to-roll processing and the surface roughness of face side rollers.

According to another aspect of the present invention, the height of the spacer structures is preferably larger than the diameter of typical particles and in the order of 1 micrometer to 500 micrometers and more preferably between 10 micrometers to 200 micrometers.

In another example of the present invention, the substrate is made from flexible material that can be rolled up and is suitable for use on a roll to roll production line. It has been found that when coated substrates are rolled up in such a manner the active layer on the coated surface can be relatively easily damaged by handling, free particles on the surface or a number of other causes.

In order to reduce the risk of damage to the active region a further option is to place protection spacer elements on the non coated side of the substrate. Such spacer elements can protect the thin film coatings from damage during winding up and unwinding caused by abrasion or rubbing together of adjacent layers. However it also has been found that the spacers themselves can damage the coated thin films when they are incorrectly positioned.

Preferably in another embodiment of the invention there is a substrate material extending in a X-Y plane coated on a first surface with one or more films to form a thin film element stack, having thickness and extending in a Z direction perpendicular away from the X-Y plane, a second surface having on it at least one spacer element, the spacer element extending in a Z direction perpendicular away from the X-Y plane to a distance greater than the thickness of the thin film element, the spacer element being positioned on the substrate such that when the substrate material is rolled onto a roll the spacer element engages with a zone of interconnection formed between the thin film layers on the first surface.

Advantageously, the spacer element on the second surface of the substrate then engages with an inactive area on the coated first surface of the substrate, with the reduced risk of damage to the active area of the thin film elements.

The positioning and patterning of the spacers on the second surface, which is inactive, can be adjusted to ensure the risk of minimal damage to the films.

Preferably, the substrate is made from a flexible material.

According to another aspect of the present invention there is provided a substrate material in which the zone of interconnection is a 3-dimensional zone extending in an x-y plane over the substrate and extending in a z direction perpendicular to the X-Y plane and away from the substrate.

BRIEF DESCRIPTION OF THE DRAWINGS

Embodiments of the invention will now be more fully described, by way of example, with reference to the drawings, of which:

FIG. A1 is a schematic drawing of the cross section through the serial interconnection of adjacent solar cell elements.

FIG. A2 is a schematic drawing of the cross section of a parallel connection in which the conductive grid line collects current from the bottom electrode.

Figure 1:
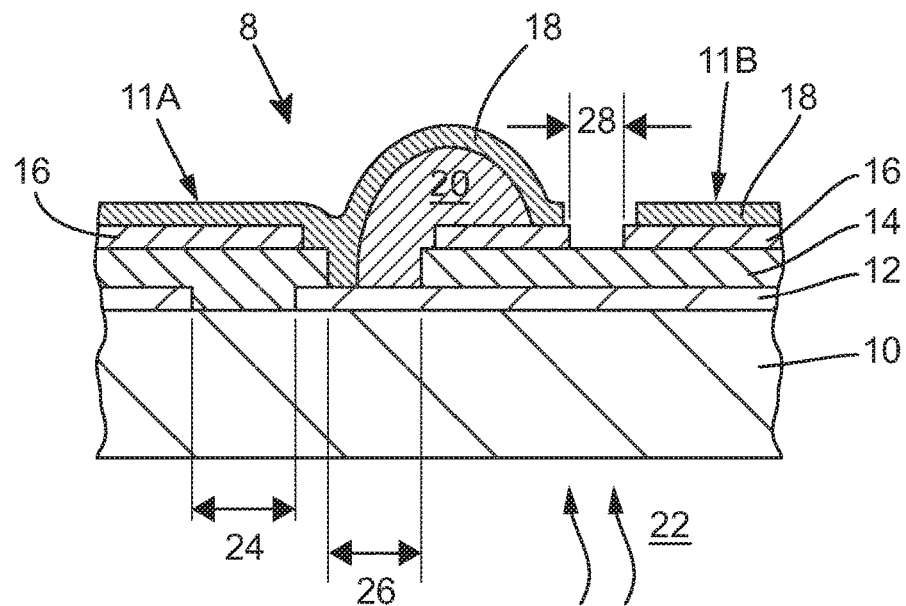
Figure 2:
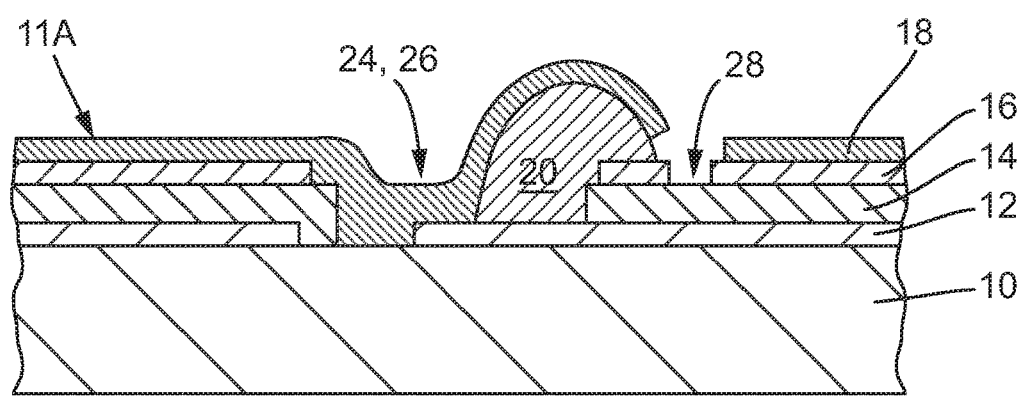
Figure 3:
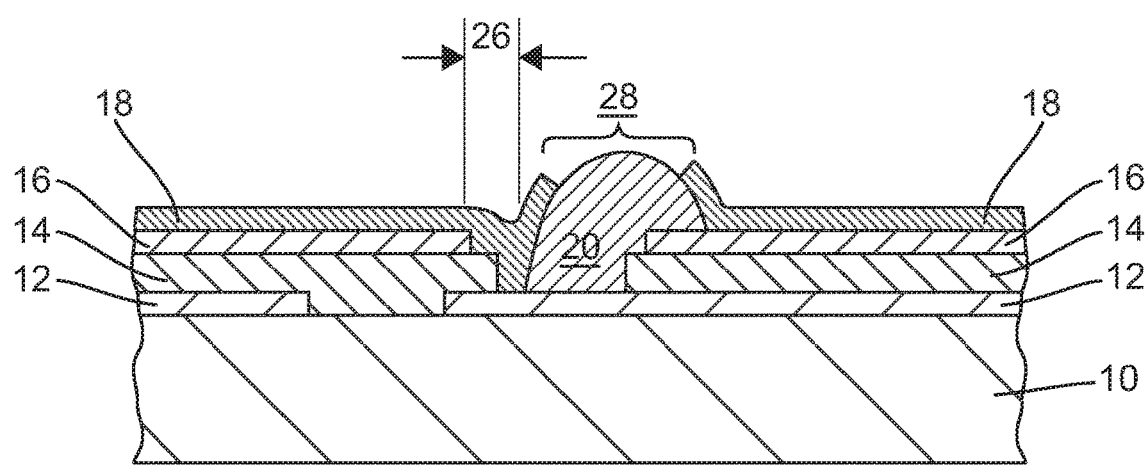
Figure 4:
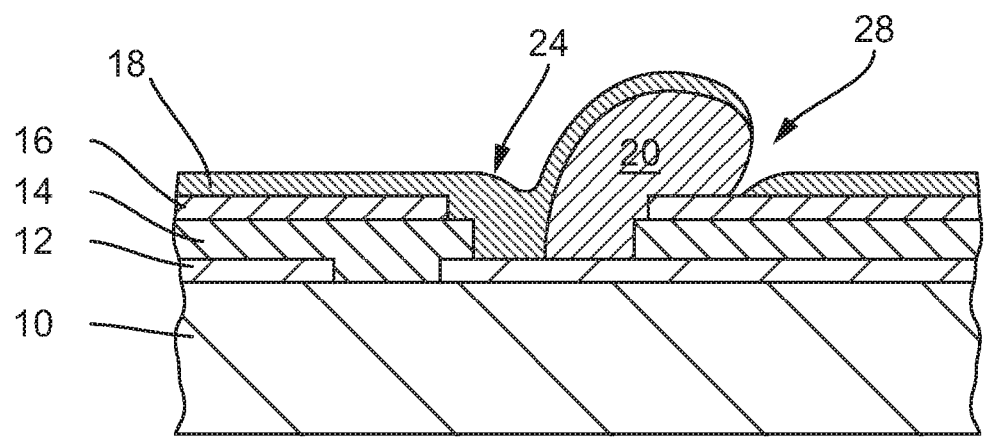
Figure 5:
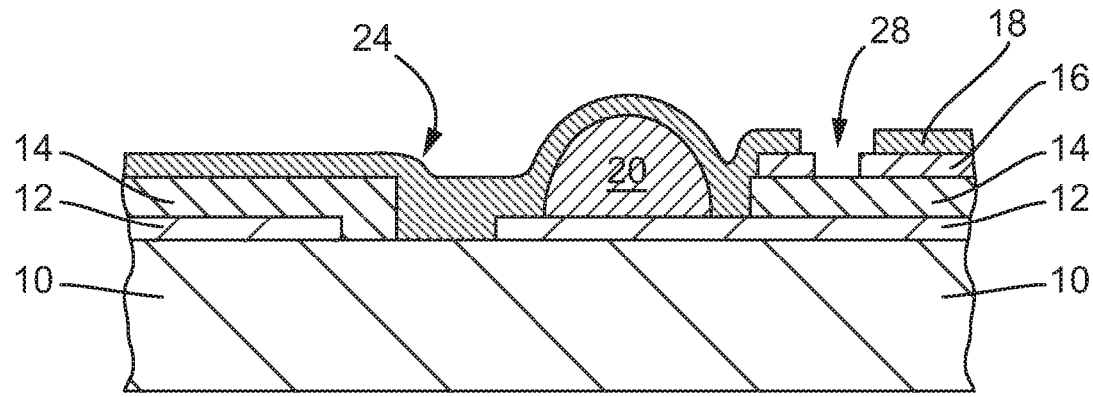
Figure 6:
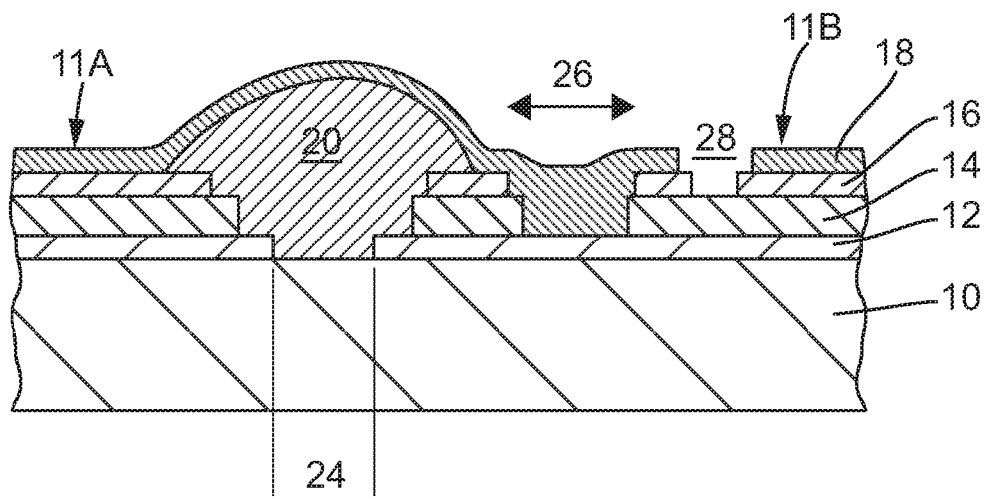
Figure 7:
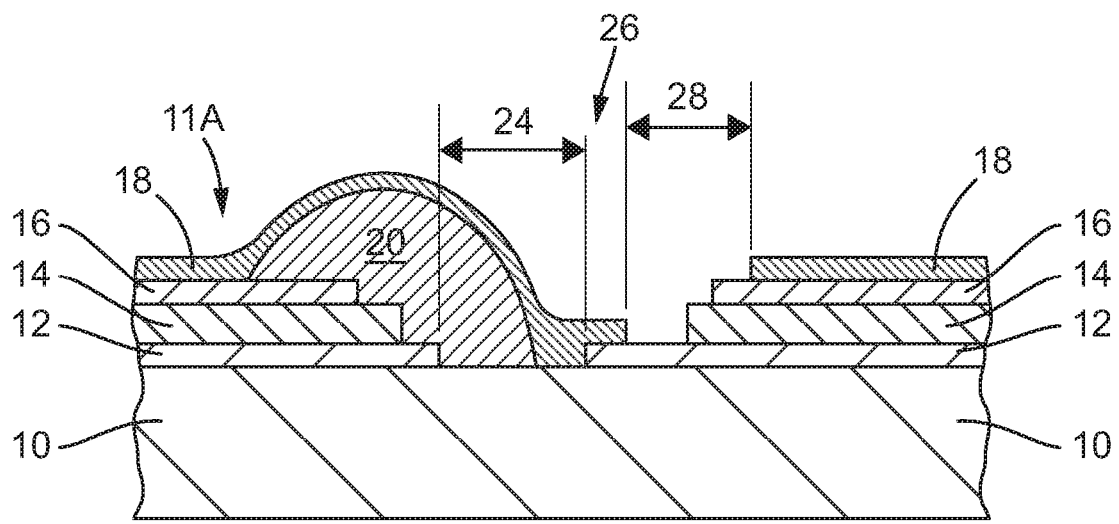
Figure 8:
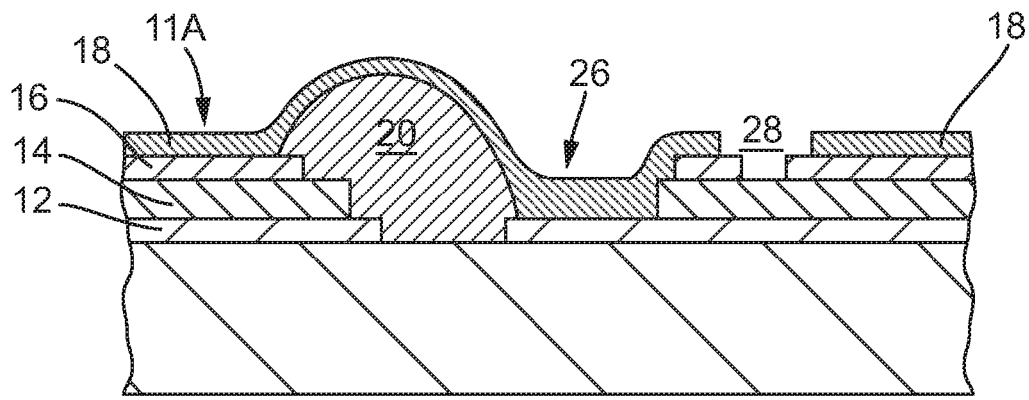
Figure 9:
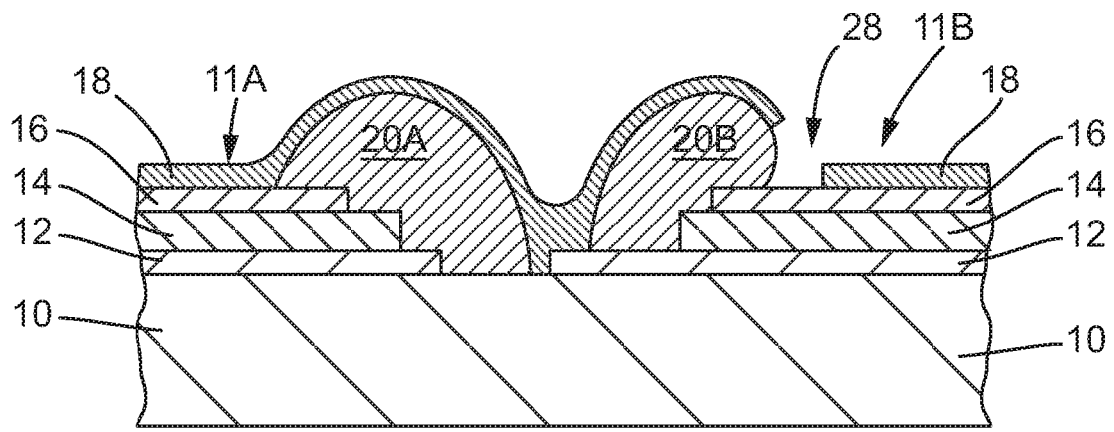
Figure 10:
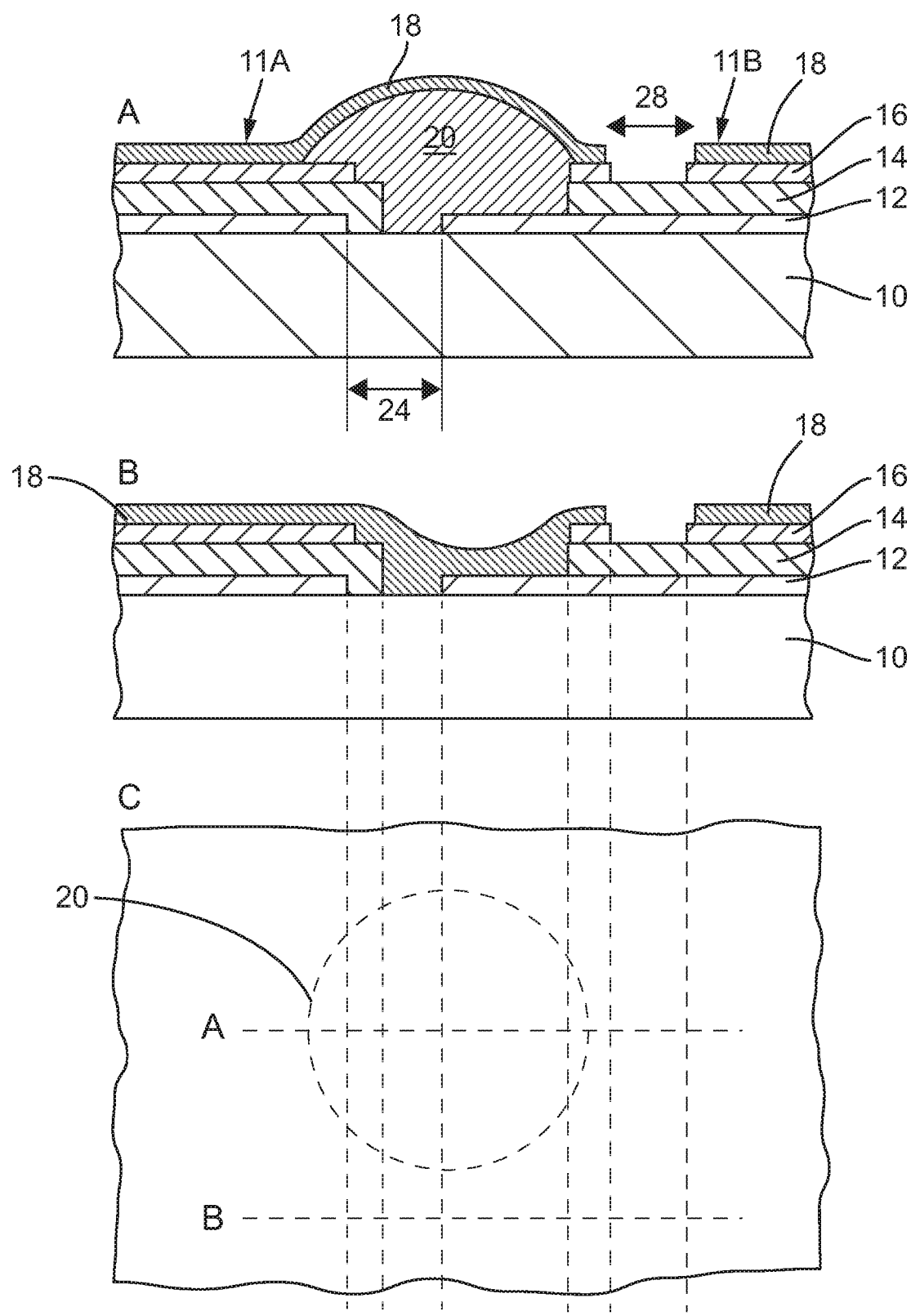
Figure 12:
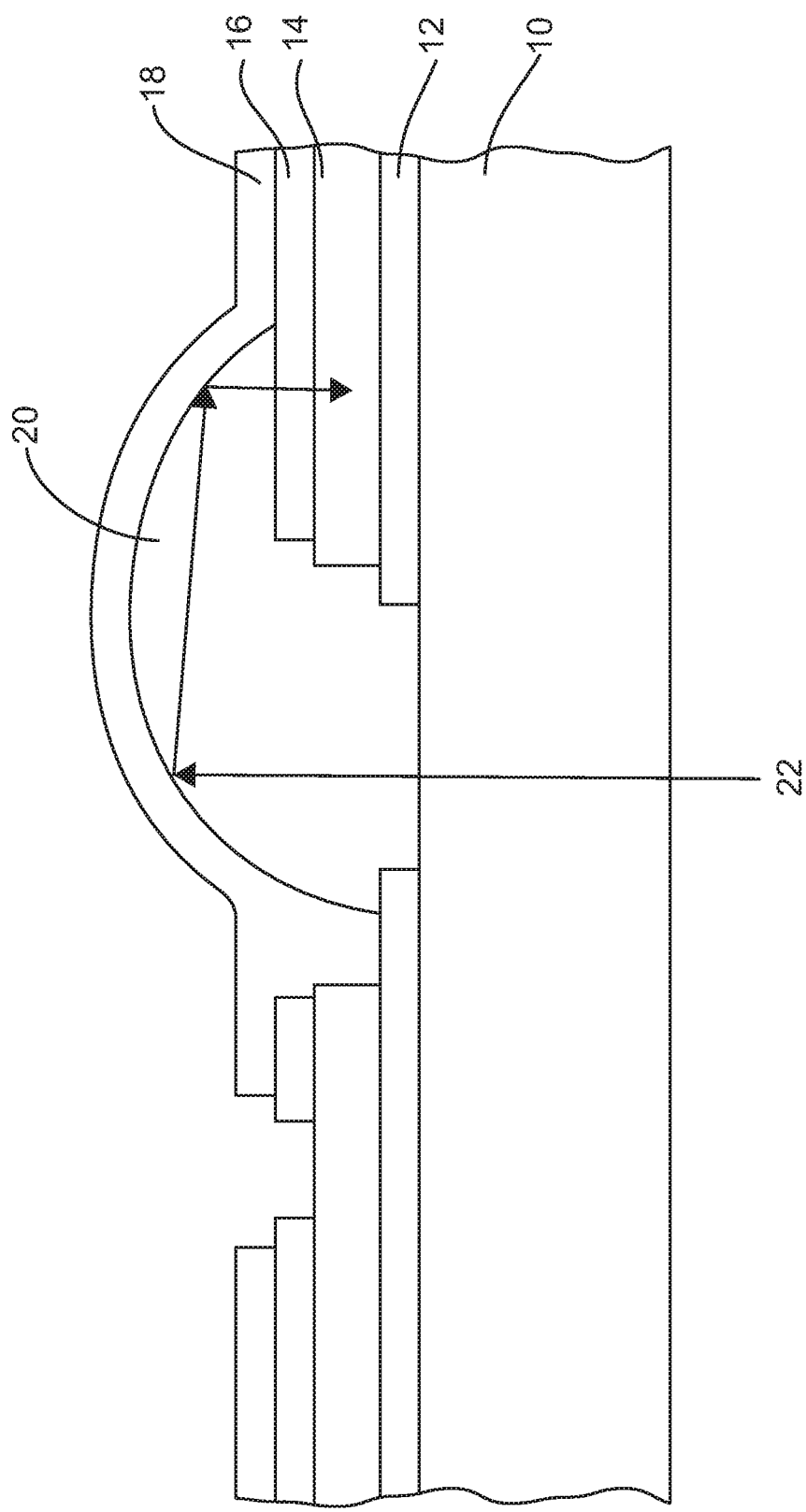
Figure 15A:
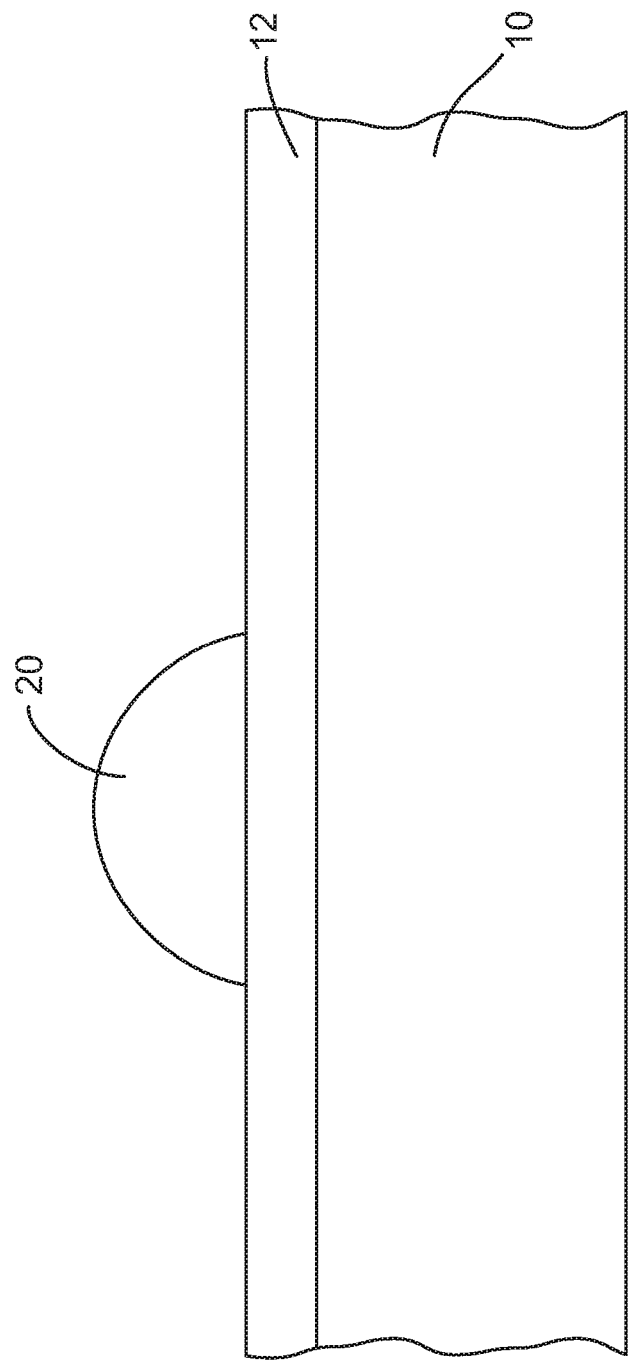
Figure 16B:
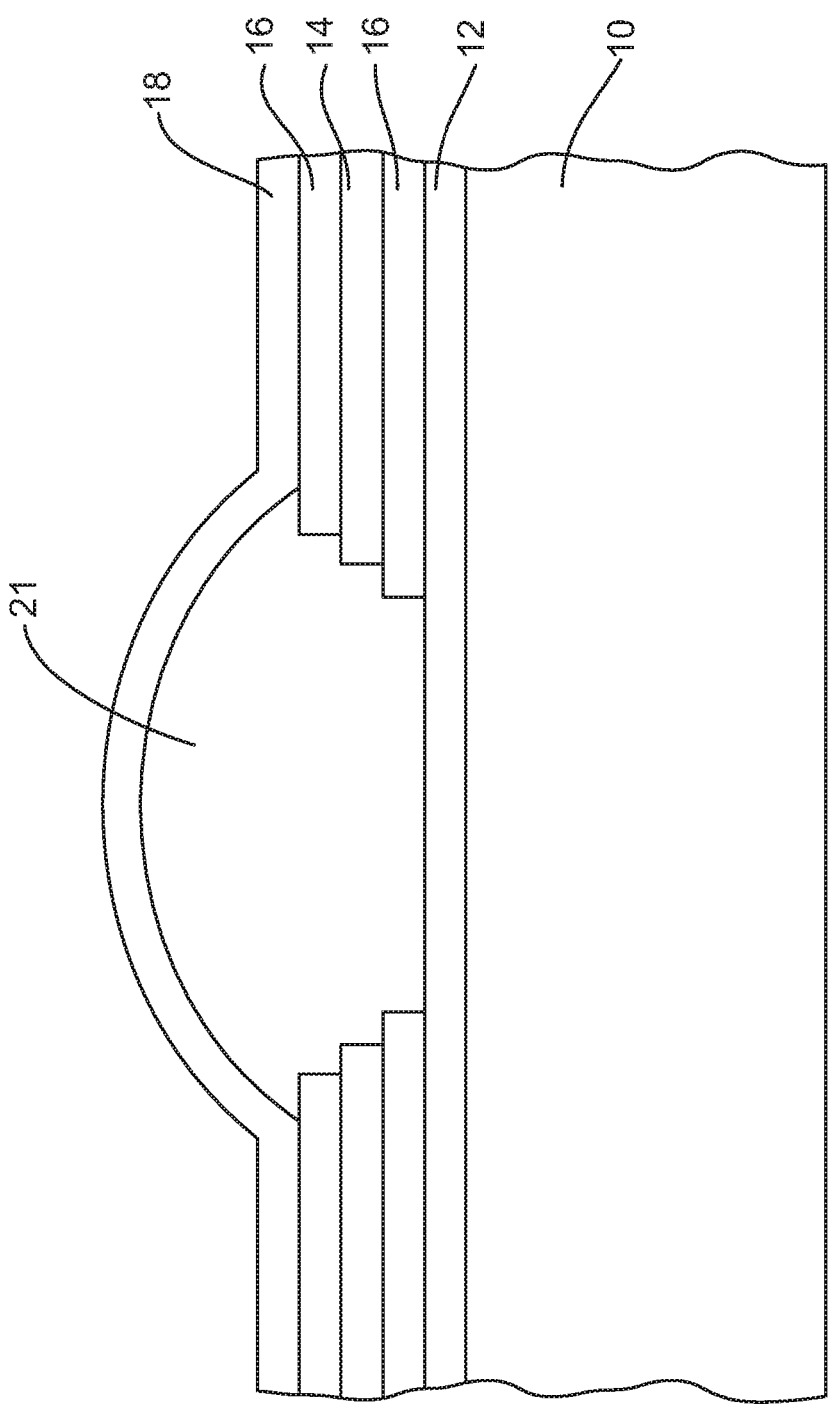

FIG. 1 is a schematic diagram of a spacer structure incorporated into a photovoltaic module according to a first embodiment of the present invention;

FIG. 2 is a schematic diagram of a spacer structure deposited over a photovoltaic cell according to a second embodiment of the present invention;

FIG. 3 is a schematic diagram of a spacer structure deposited over a photovoltaic cell according to a third embodiment of the present invention;

FIG. 4 is a schematic diagram of a spacer structure deposited over a photovoltaic cell according to a fourth embodiment of the present invention;

FIG. 5 is a schematic diagram of a spacer structure deposited over a photovoltaic cell according to a fifth embodiment of the present invention;

FIG. 6 is a schematic diagram of a spacer structure deposited over a photovoltaic cell according to a sixth embodiment of the present invention;

FIG. 7 is a schematic diagram of a spacer structure deposited over a photovoltaic cell according to a seventh embodiment of the present invention;

FIG. 8 is a schematic diagram of a spacer structure deposited over a photovoltaic cell according to an eighth embodiment of the present invention;

FIG. 9 is a schematic diagram of a double spacer structure deposited over a photovoltaic cell according to a ninth embodiment of the present invention;

FIG. 10 is a schematic diagram of a top view of a spacer structure as deposited as a discrete dot or segment;

FIGS. 11A to 11F are schematic diagrams showing an exemplary fabrication process of a final device stack;

FIG. 12 is a schematic diagram of a spacer structure with enhanced device performance characteristics;

FIG. 13 is a schematic diagram of a spacer structure adjacent a device stack illustrating a representative scale;

FIG. 14 is a schematic diagram of a spacer structure adjacent a device illustrating a representative scale;

FIG. 15A: shows a spacer structure deposited onto the first electrode;

FIG. 15B: shows a spacer structure deposited (partially or fully) on the substrate in the gap of a bottom electrode;

FIG. 16A: shows a spacer structure deposited on top of a thin film stack;

FIG. 16B: shows a spacer structure deposited on top of the bottom electrode in the gap of a thin film device stack.

Figure 16C:
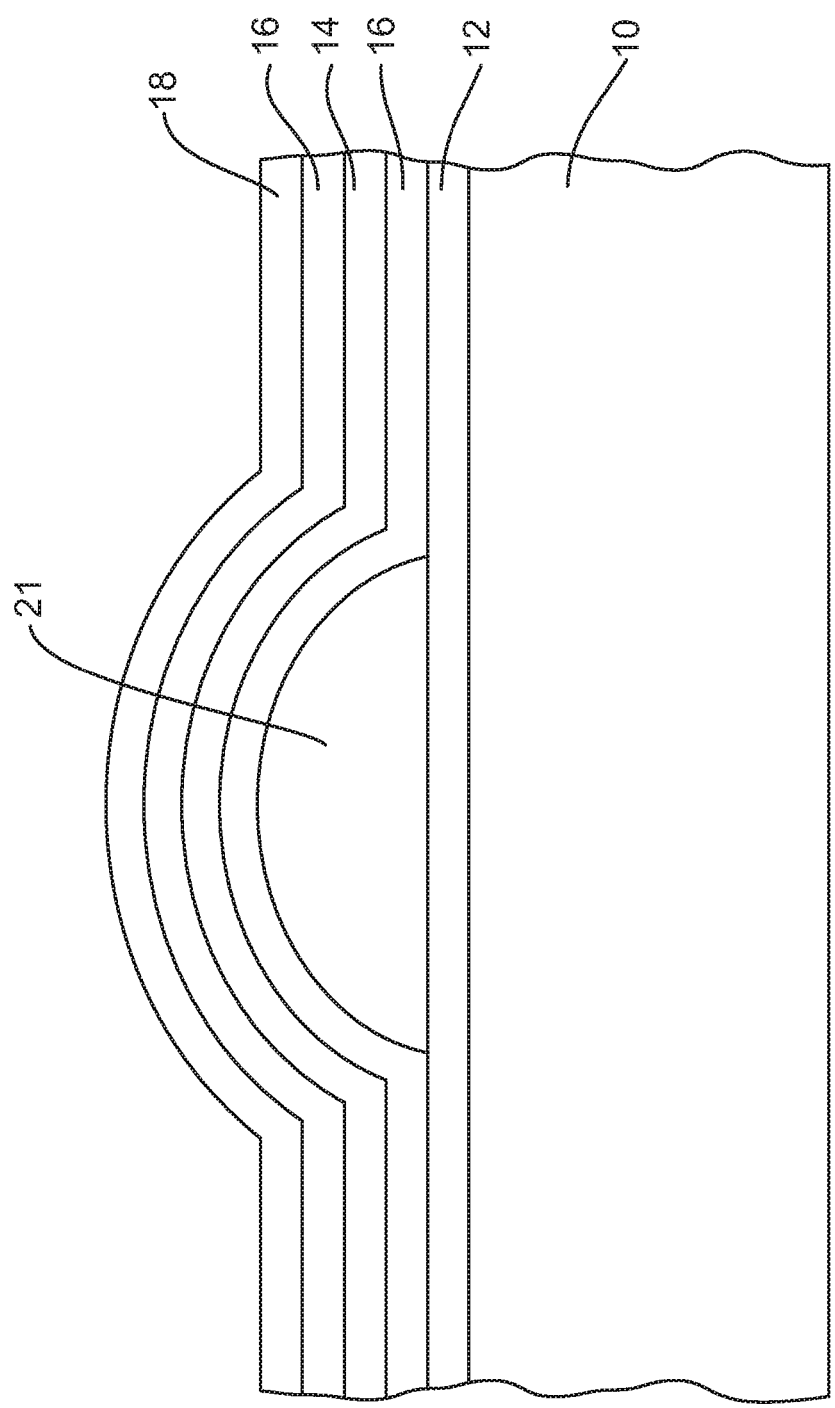
Figure 16D:
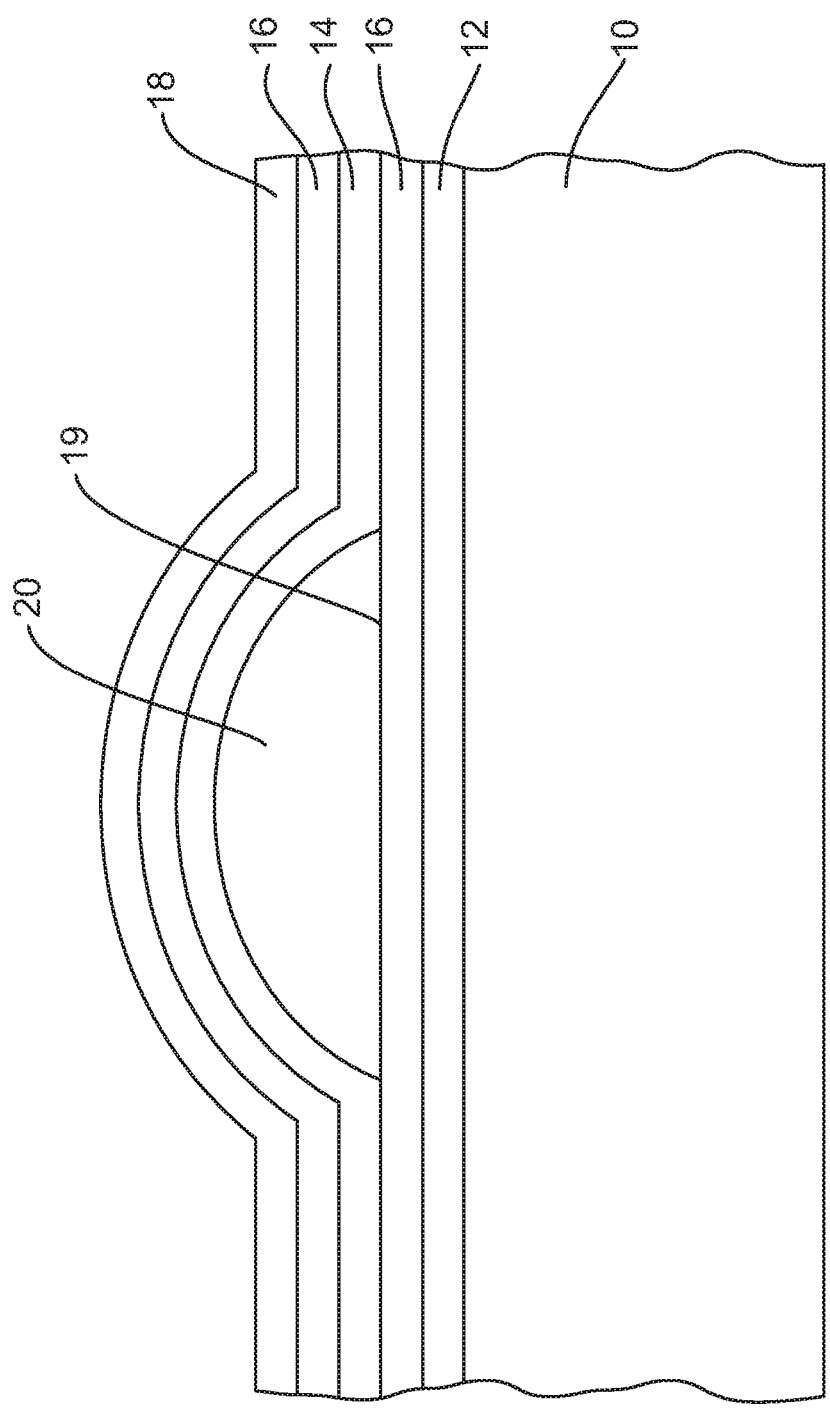

FIG. 16C: shows a spacer structure on top of a bottom electrode covered by a thin film device stack FIG. 16D: shows a spacer structure sandwiched between two thin film device stacks.

Figure 16E:
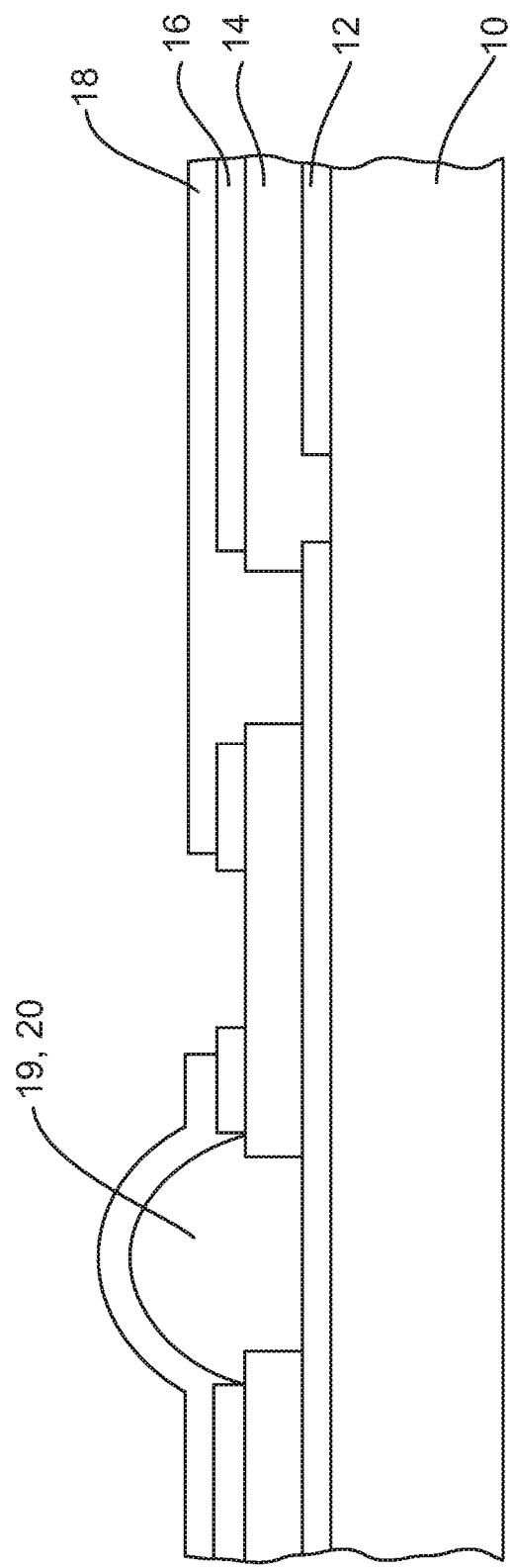
Figure 17:
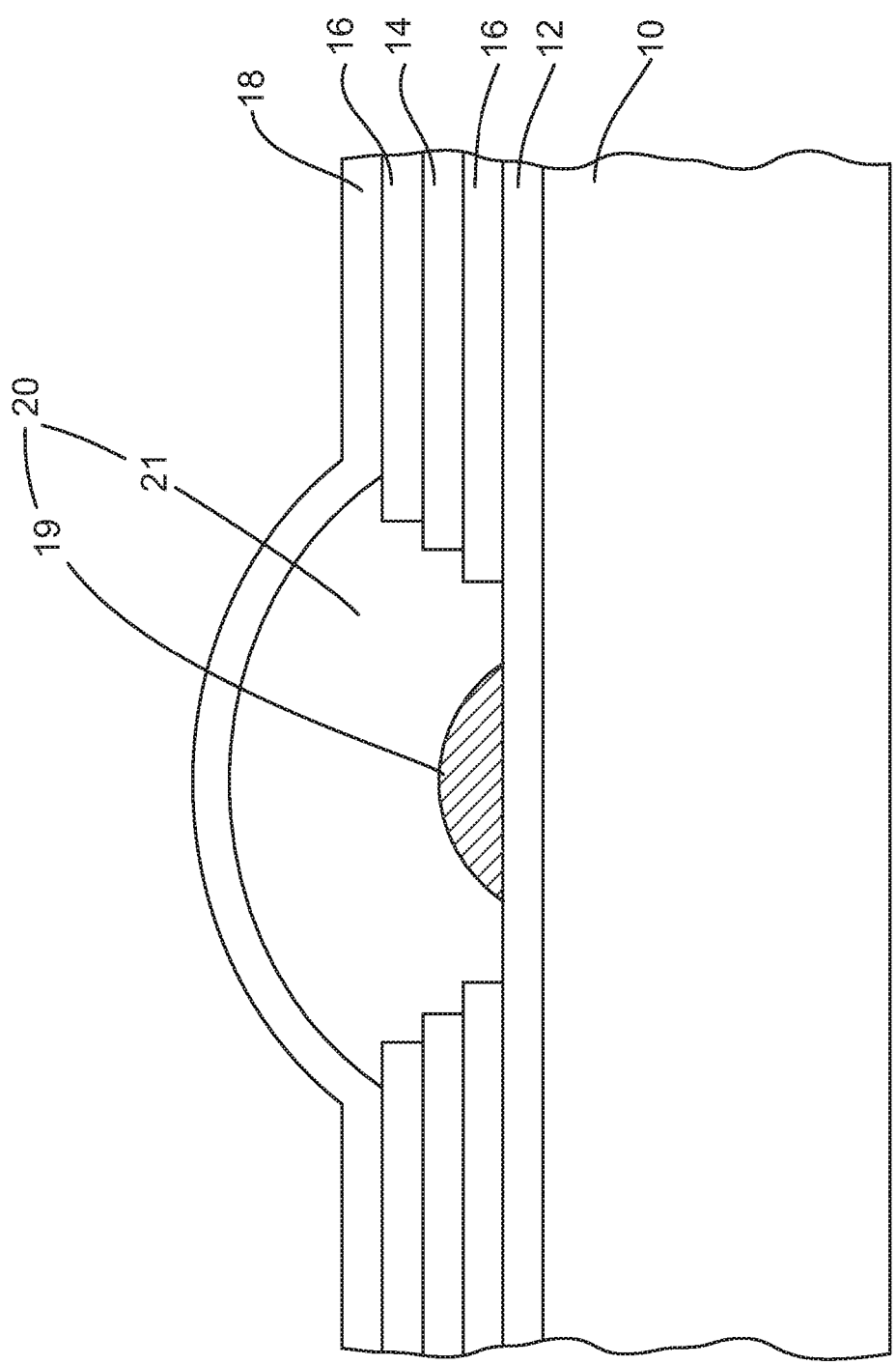
Figure 18:
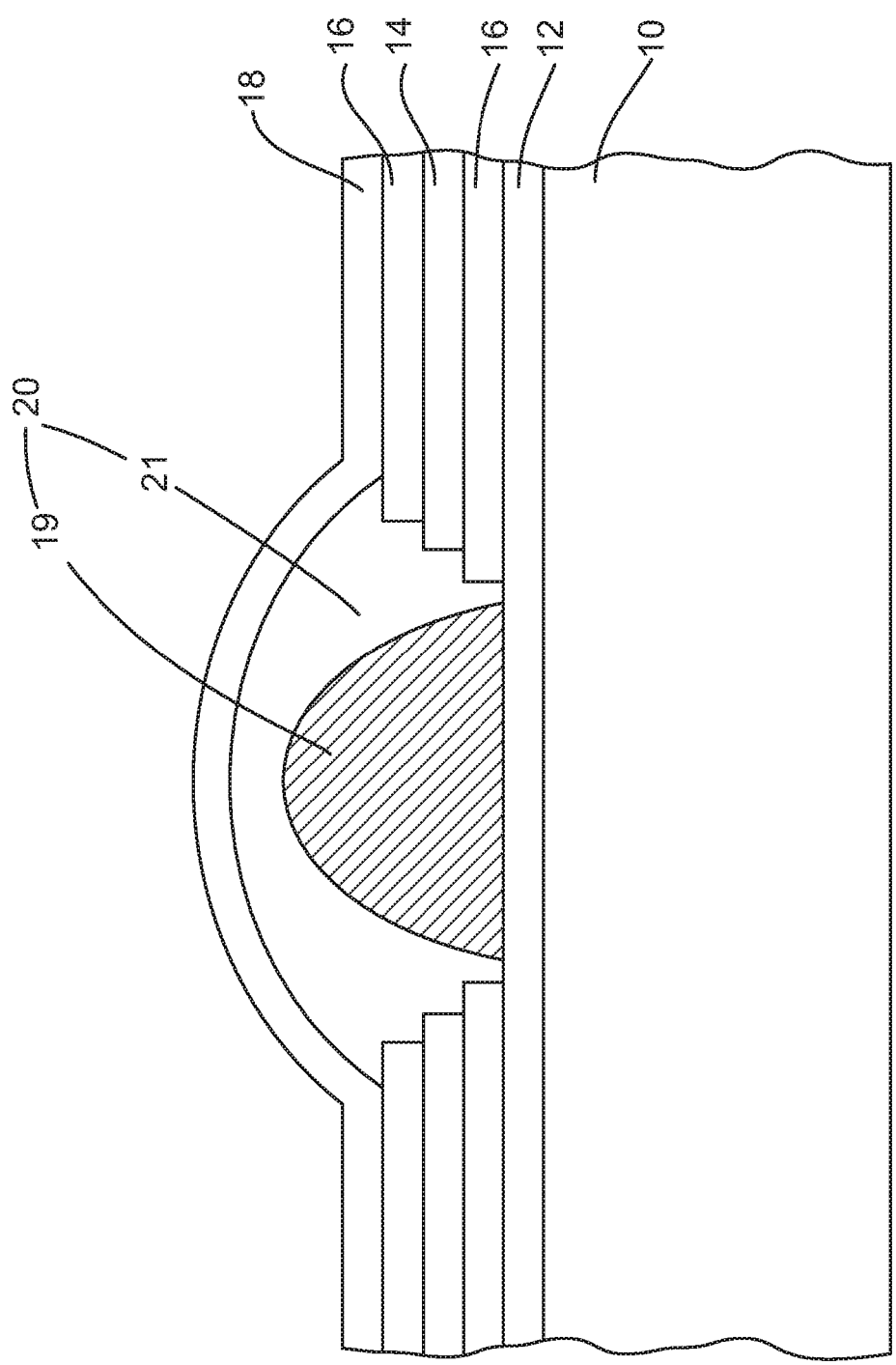
Figure 19:
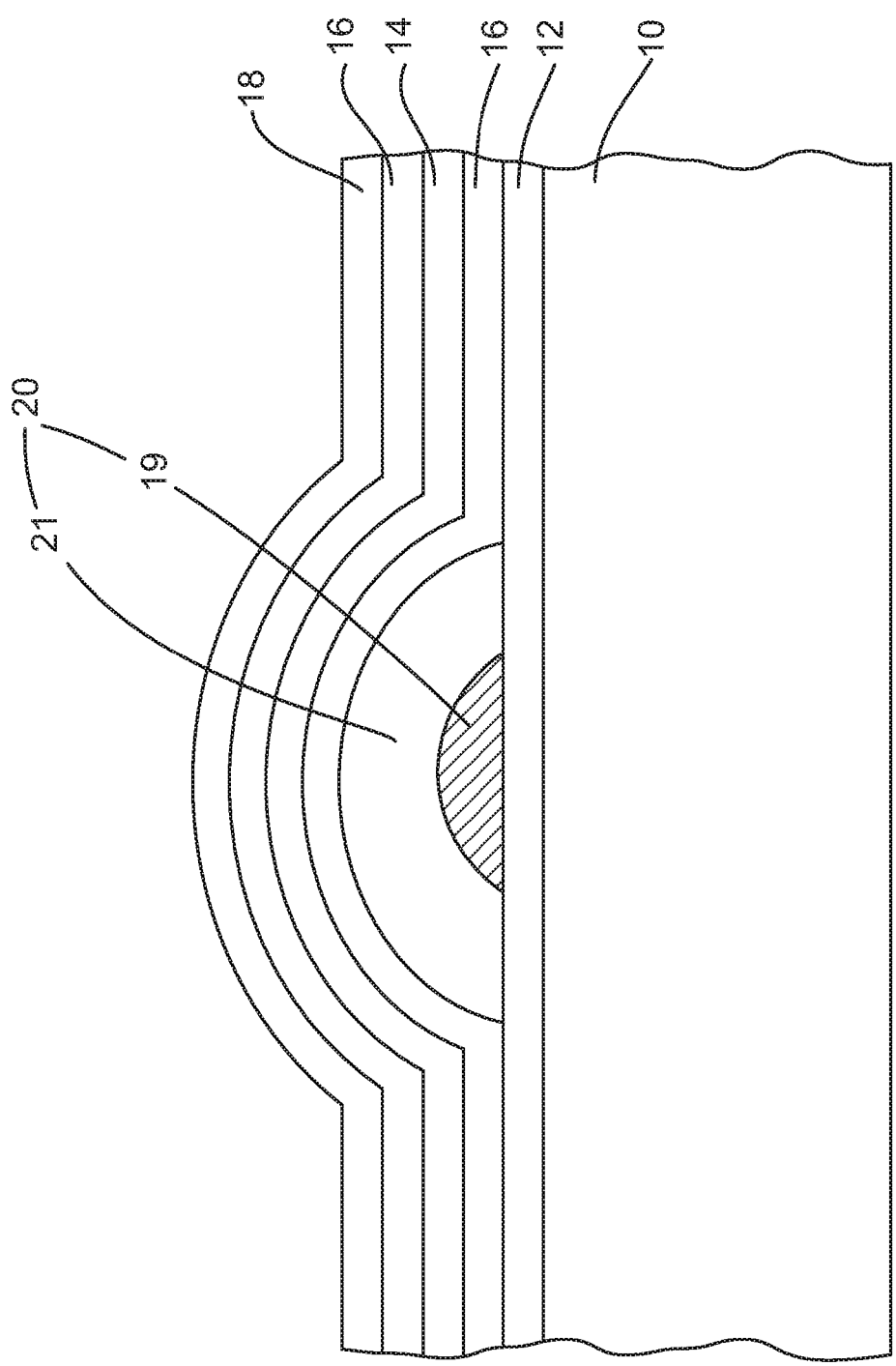
Figure 20:
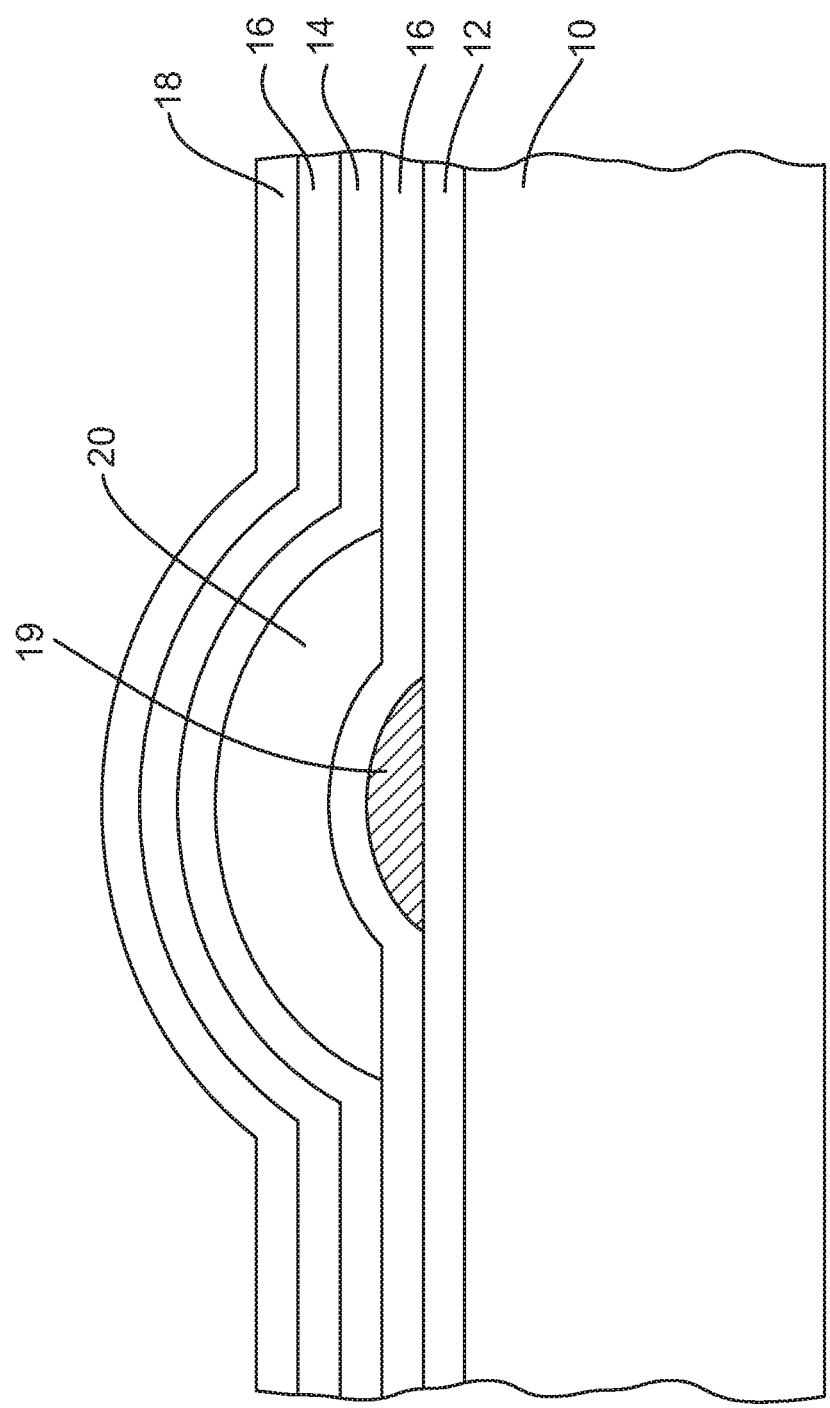
Figure 21:
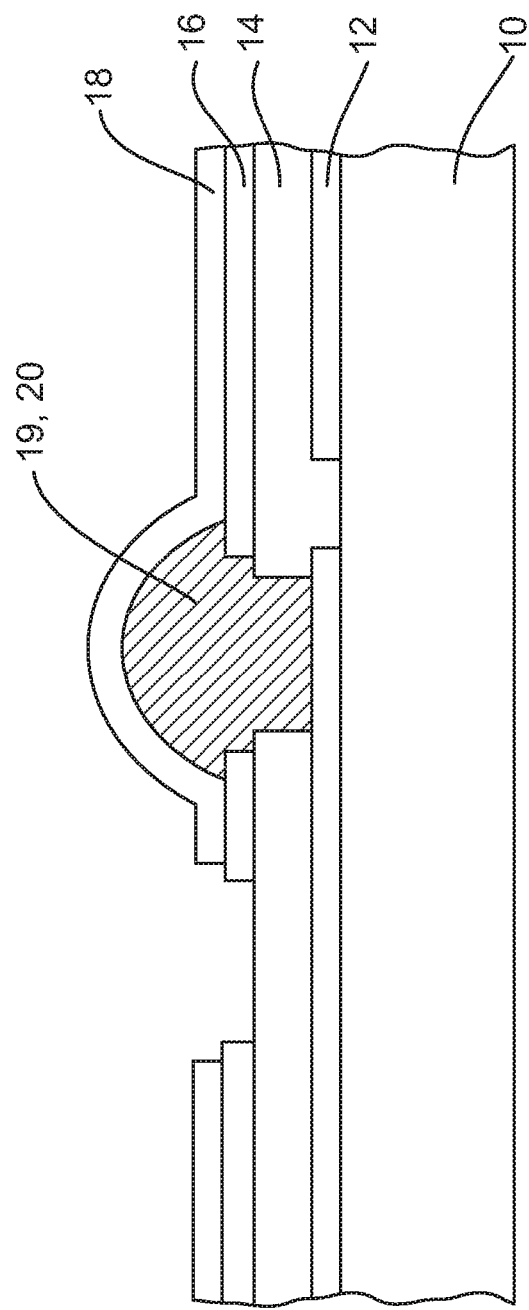
Figure 22:
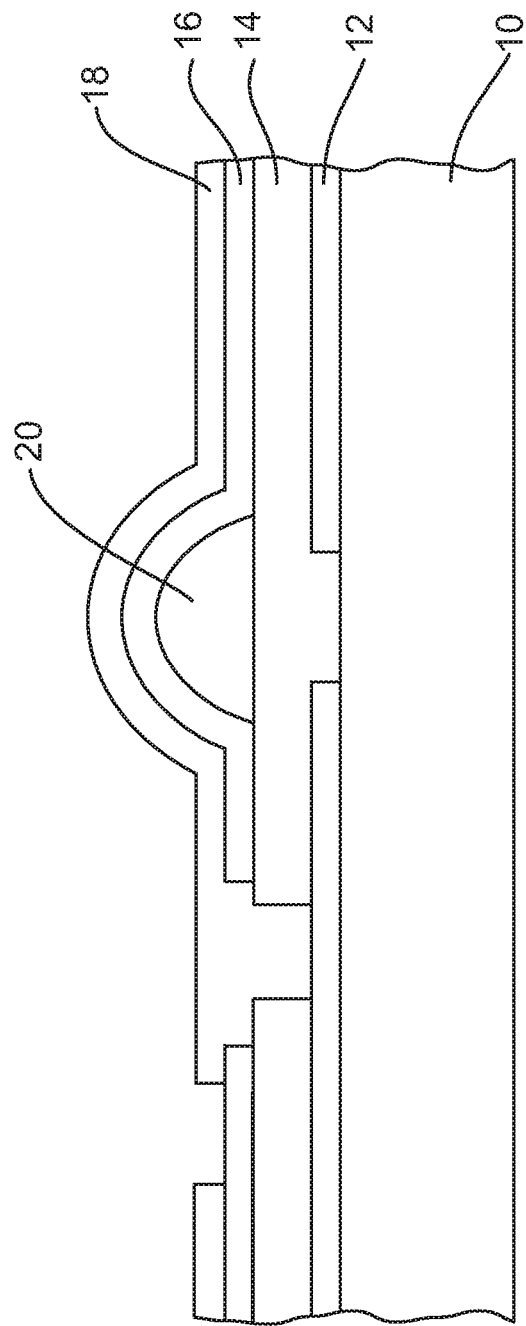
Figure 23:
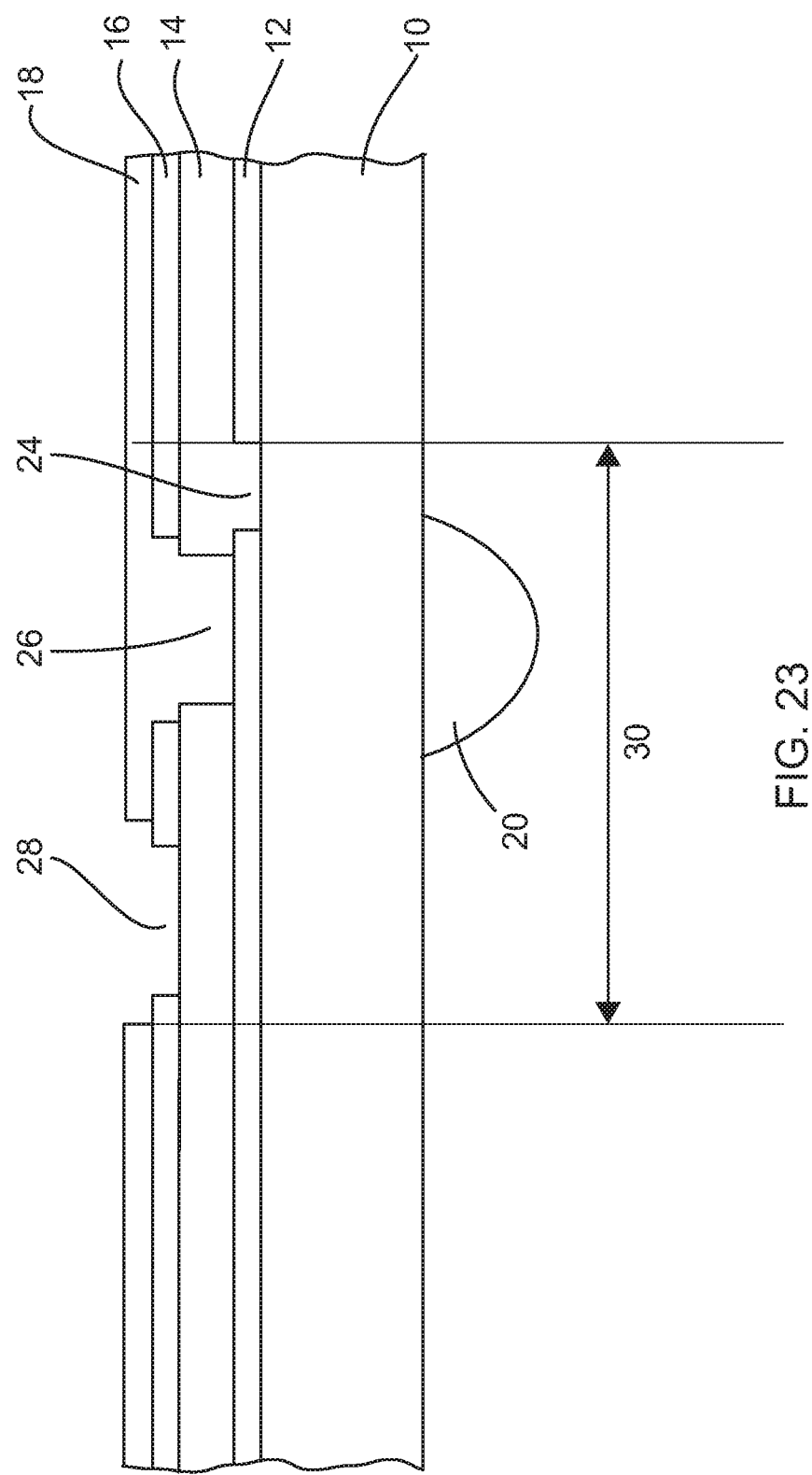
Figure 24:
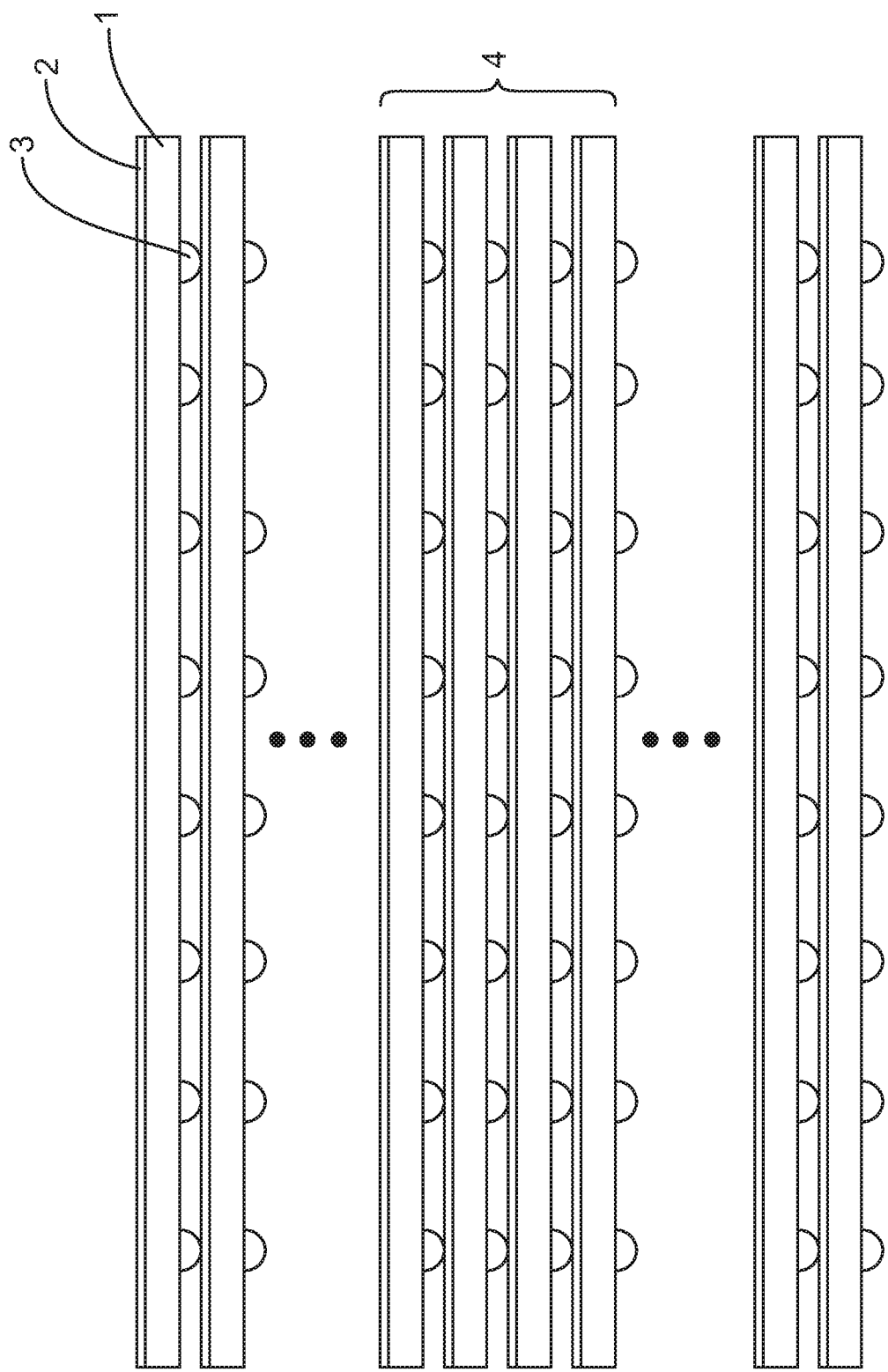

FIG. 16E: shows a spacer structure deposited outside the zone of interconnection FIG. 17: shows a spacer structure configuration for parallel interconnection;

FIG. 18: shows another spacer structure configuration for parallel interconnection;

FIG. 19: shows a further spacer structure configuration for parallel interconnection;

FIG. 20: shows a general positioning of the spacer structure for parallel interconnection;

FIG. 21: shows a spacer structure configuration for serial interconnection;

FIG. 22: shows a different spacer structure configuration for serial interconnection;

FIG. 23: shows a spacer structure on the opposite side of the thin film coating which will engage in the zone of interconnection; and FIG. 24: shows a cross section of a rolled up web including thin coated films with spacer elements located on the opposite side of the substrate to the coated thin films.

In the following description of the figures like reference numerals shall be used to identify like parts.

Figure A1 depicts a cross section through the serial interconnection of adjacent solar cell elements. For simplification, only a substrate material 10, a bottom electrode 12, a photoactive layer 14 and a top electrode 18 are shown. The P1 feature 24 represents the separation of the bottom electrode 12 between adjacent cells, the P2 feature 26 represents the interconnection between top and bottom electrode between adjacent cells. Feature P3, shown as 28, represents the separation of the top electrode between adjacent cells. The zone of interconnection 30 is defined by the outer boundaries of the P1 feature and the P3 feature.

FIG. A2 depicts a cross section of a parallel connection. The conductive grid line 19 is electrically connected to the bottom electrode 12. The device compartments separated by the conductive grid lines are therefore effectively connected in parallel. The zone of interconnect 30 is defined by the area covered by the current collecting feature.

Referring to FIGS. 1 to 9, a section of a solar module 8 comprises a substrate 10 formed of a plastics material such as a Polyethylene terephthalate (PET). A solar cell 11A is deposited over the substrate 10 and comprises a bottom electrode 12, a photoactive layer 14, an interface layer 16 and a top electrode 18. Incident light will normally fall on the substrate 10 in the general direction indicated by lines 22.

In FIGS. 1 to 9, the spacer structure 20 is deposited in a deposition feature adjacent to the solar cell stripes 11A, 11B and extends substantially along the length of the solar module in the X-Y plane. Accordingly, in FIGS. 1 to 9, the spacer structure 20 deposition feature may be substantially continuous in the form of a continuous bead of material or intermittent in the form of intermittent beads of material. In FIG. 10, a spacer structure formed by dots is shown instead of continuous beads.

The bottom electrode 12 is a transparent layer or opaque. An example for an opaque electrode is a sandwich of thin chromium (adhesion promotion).

Aluminium (sheet conductivity) and Chromium layers (interface layer). A transparent bottom electrode 12 may also comprise indium tin oxide, or some other metal-oxide/metal/metal-oxide layer system coated with a specific oxide providing an ohmic contact. Such specific contact could be formed from TiOx or ZnOx (either doped or intrinsic) deposited by vacuum processing or as sol-gel or nanoparticle from solution.

The photoactive layer 14 may be a blend of a conjugated polymer and a fullerene derivative such as a blend of poly (3-hexylthiophene) (P3HT) and [6, 6]-phenyl C61-butyric acid methylester (PCBM). P3HT, the main absorber in this photoactive composite has a band gap of around 2.1 eV and absorbs wavelengths of up to around 650 nm. Alternatively, the photoactive layer 14 may comprise a blend of two conjugated polymers one presenting the donor and one the acceptor, or a combination of two or more molecular species with donor and acceptor characteristics respectively.

Other suitable photoactive layers 14 may comprise: p-phenylenevinylene-based 5 conjugated polymers such as (poly(2-methoxy-5-((3',7'-dimethyloctyl)oxy)-1,4-phenylenevinylene) (MDMO-PPV); fluorene-based conjugated polymers, e.g. 2,1,3-benzothiadiazole-containing PF, poly (9,9-dioctylfluorene-2,7-diyl-alt-4,7-bis (3-hexylthien-5-yl)-2,1,3-benzothiadiazole-2',"2-diyl). Further suitable photoactive layers 14 may comprise $CH_3NH_3PbI_{3-x}Cl_x$ perovskite or lead free versions for example methylammonium tin triiodide ($CH_3NH_3SnX_3$).

The interface layer 16 comprises a hole collection compound such as poly(3,4-ethylenedioxythiophene)-poly(styrene sulfonate) ((PEDOT)-PSS) or polyaniline-poly(styrene sulfonate) (Pani). Alternative hole collection compounds include metal oxides such as $MoO_3$, $NiO$, or $V_2O_5$ The top electrode 18 is deposited over the interface layer 16 and may comprise a vacuum deposited metal electrode. Suitable metals include Silver, Aluminium, Copper and Gold, or alloys or combinations thereof.

Alternatively the top electrode can be based on particular metal or a precursor thereof. Top electrodes can be also deposited from solution in the form of metal nanoparticles or nanowires (for instance silver nanowires). The latter will, in combination with a conductive filler like PEDOT:PSS, allow realization of a semi-transparent electrode. Semi-transparent top electrodes can be realized by vacuum deposited thin metal layers, often sandwiched between metal-oxide layers. The deposition of these layers could be done by coating and printing techniques. In the case of an opaque bottom electrode or a fully transparent device, the top electrode is sufficiently transparent to allow for the transmission of light.

Referring to FIG. 1, a first P1 patterning feature 24 provides the separation of the bottom electrode 12 between neighbouring solar cells 11A and 11B. A second P2 patterning feature 26 provides an exposed space to be filled by a conducting material for the electrical interconnection between top 18 and bottom 12 electrodes of neighbouring solar cells 11A and 11B. As can be seen from FIG. 1, the electrical interconnection between the top electrode 18 of solar cell 11A and bottom electrode 12 of solar cell 11B is provided by the deposition of the top electrode 18. A third P3 patterning feature 28 provides a separation of the top electrode 18.

In FIG. 1, a spacer structure 20 is deposited partially within the second P2 patterning feature 26 on and in contact with the bottom electrode 12 and covering a portion of the photoactive layer 14 and interface layer 16. The spacer structure 20 will normally comprise a dielectric material. The spacer structure 20 can also include an optical function as described below.

Referring to FIG. 2, the spacer structure 20 is deposited partially within the second P2 patterning feature 26 on and in contact with the bottom electrode 12 and covering a portion of the photoactive layer 14 and interface layer 16. The substrate 10 has been exposed such that the top electrode 18 whilst providing the electrical interconnection between the top electrode 18 of solar cell 11A and bottom electrode 12 of solar cell 11B contacts an exposed space of the substrate 10.

Common to FIG. 1 and FIG. 2 is that the third P3 patterning feature 28, that provides a separation of the top electrodes 18 of two adjacent cells, is located on the side of the dielectric spacer 20 opposite to the electrical interconnection.

Referring to FIG. 3, the spacer structure 20 is deposited partially within the second P2 patterning feature 26 on and in contact with the bottom electrode 12 and covering a portion of the photoactive layer 14 and interface layer 16. The third P3 patterning feature 28 that provides a separation of the top electrode 18 is located on top of dielectric spacer 20.

Referring to FIG. 4, the spacer structure 20 is deposited partially within the second P2 patterning feature 26 on and in contact with the bottom electrode 12 and covering a portion of the photoactive layer 14 and interface layer 16. The third P3 patterning feature 28 that provides a separation of the top electrode 18 is formed from a shadowing effect or masking effect of the spacer structure 20. The three-dimensional structure of the spacer structure 20 provides an undercut which prevents material deposition over the entire layer of the top electrode 18 during electrode deposition.

Referring to FIG. 5, the spacer structure 20 is deposited fully within the second P2 patterning feature 26 entirely on and in contact with the bottom electrode 12. The spacer structure 20 does not cover a portion of the photoactive layer 14 and interface layer 16. The third P3 patterning feature 28 that provides a separation of the top electrode 18 is located on the side of the dielectric spacer 20 opposite to the electrical interconnection.

Referring to FIGS. 6 to 9, a device architecture is based on carrying out a first P1 patterning feature 24 providing the separation of the bottom electrode 12 between neighbouring solar cells 11A and 11B after the deposition of the photoactive layer 14 and interface layer 16. In this case, the P1 patterning feature 24 is carried out through an entire layered stack.

Referring to FIG. 6, the spacer structure 20 is deposited on the substrate 10 exposed by the first patterning feature 24 and partially covers the edge of all layers of the solar cell 11A. Without the presence of the spacer structure 20 covering the exposed edge of the bottom electrode 12, the solar cell 11A would experience a short circuit between its top electrode 18 and bottom electrode 12 (upon deposition of the top electrode 18). The top electrode 18 is deposited over the entire upper surface of the spacer structure 20 and fills the second P2 patterning feature 26. A break in the top electrode 18 occurs at the third P3 patterning feature 28.

Referring to FIG. 7, the spacer structure 20 is partially deposited on the substrate 10 exposed by the first patterning feature 24 and partially covers the edge of all layers of the solar cell 11A. Without the presence of the spacer structure 20 covering the exposed edge of the bottom electrode 12, the solar cell 11A would experience a short circuit between its top electrode 18 and bottom electrode 12. The top electrode 18 is deposited over the entire upper surface of the spacer structure 20 and terminates partially within the second P2 patterning feature 26.

Referring to FIG. 8, the spacer structure 20 is partially deposited on the substrate 10 exposed by the first patterning feature 24 (not shown) and partially covers the edge of all layers of the solar cell 11A. Without the presence of the spacer structure 20 covering the exposed edge of the bottom electrode 12, the solar cell 11A would experience a short circuit between its top electrode 18 and bottom electrode 12. The top electrode 18 is deposited over the entire upper surface of the spacer structure 20 and entirely fills the second patterning feature 26 extending to cover the interface layer 16 of the neighbouring solar cell 11B. As such a third P3 patterning feature 28 provides a separation of the top electrode 18.

Referring to FIG. 9, a double spacer structure 20A, 20B is shown. The first spacer structure 20A is partially deposited on the substrate 10 exposed by the first patterning feature 24 and partially covers the edge of all layers of the solar cell 11A. Without the presence of the first spacer structure 20A covering the exposed edge of the bottom electrode 12, the solar cell 11A would experience a short circuit between its top electrode 18 and bottom electrode 12. The second spacer structure 20B is spaced from the first spacer structure 20A and is deposited on the bottom electrode 12 and partially over the edge regions of the photoactive layer 14 and the interface layer 16 of the neighbouring solar cell 11B. The top electrode 18 is deposited over the entire upper surface of the first spacer structure 20A and over the second patterning feature 26, extending towards the top electrode 18 of the neighbouring solar cell 11B. The second spacer structure 20B acts to form the P3 patterning feature separation 28 of the top electrode.

An advantage of using two different spacer structures is that these can be made from different materials. Material of spacer structure 20A provides dielectric properties such that it electrically isolates the exposed edge of cell 11A. Spacer structure 20B provides the separation of the top electrode (P3). This can be achieved by a shadowing effect caused by a large contact angle of the spacer structure, by a microscopic shadowing effect on a porous and rough surface or by another material. In these cases, the spacer function can be fulfilled by either or both spacer structures. Another variant of this configuration is a dielectric spacer structure 20A combined with a line of oil deposited instead of structure 20B.

The purpose of the line of oil is to prevent the deposition of metal in this region during vacuum metallization (this type of process is known) and as a result forms the separation P3. In this configuration, the spacer structure prevents the oil line from coming into contact with rollers and/or the back side of the web during wind-up (prior to metallization). Alternative materials for the structure 20B are greases or waxes, which have the properties which will prevent the deposition of a metal electrode or even other material over a particular surface.

The second structure to be protected can be made from any material in principle, but an advantageous material set would be one which prevents electrode deposition during the final electrode deposition. Where the final electrode is deposited via a thermal evaporation step, a thin structure formed of low vapour pressure oil, based on for example silicone or polyphenyl ethers, or low vapour pressure grease or wax would be advantageous. Example of a preferred oil would be silicone based diffusion pump oil 704 supplied by Conquest West or Santovac 5™ from Edwards High Vacuum which is a polyphenyl ether based product. An example of a suitable grease would be Apiezon™ greases L, M, N or T which are hydrocarbon based and some of which contain wax. An example of a suitable wax would be Apiezon™ W, or even paraffin wax, depending on process temperature and vapour pressure tolerances. Another option would be partly or completely uncured UV curing compound such as Dupont 5018. These materials could be deposited by any known technique suitable for the particular blocking material chosen, such as non-contact printing (e.g. thermal Ink-Jet), flexo printing (especially the oils), or nozzle dispensing (especially the more viscous materials) at a temperature where they display good feature forming characteristics. In some instances it may be required to add wetting agents to the compositions.

Additionally it can be beneficial to incorporate materials which show high levels of roughness in the feature to be protected, so that, during final electrode deposition, a significant charge percolating network is prevented from being formed across the structure. An example of this is Mica, which can exist as very fine flakes, such as found in MKT™ produced by Imerys Performance Minerals.

FIG. 10 shows an alternative arrangement for the spacer structure. FIG. 10A is a side elevation and similar to all the other previous figures. FIG. 10C is a plan view of the spacer arrangement of FIG. 10A. Lines A and B show the positions of the side elevations shown in FIGS. 10A and 10B. The spacer element 20 is shown as a circle of dotted lines, indicating that in this example the spacer is a circular shape or drop. As an alternative, it could be any other convenient shape to fit within the patterning, such as elliptical or an elongated dash type pattern.

Figure 11A:
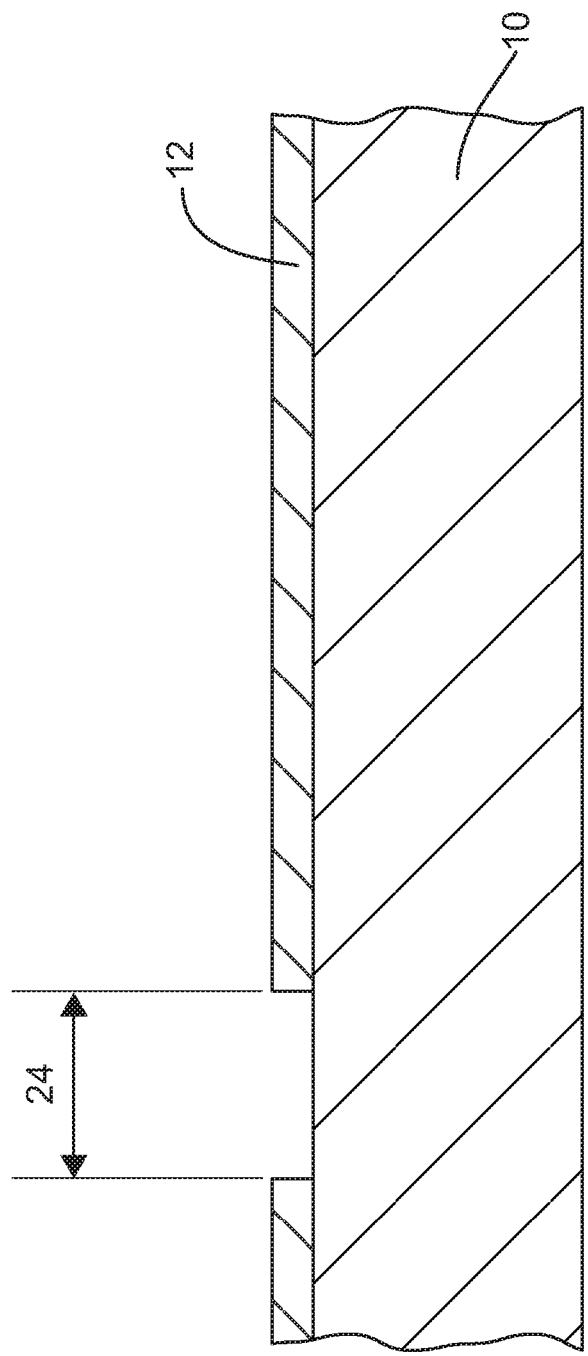

FIGS. 11A to 11F illustrate a sequence for fabrication of a solar module 8 according to embodiments of the invention. Although the final patterned device stack illustrated at FIG. 11F is identical to the device stack illustrated at FIG. 1, the general principles of deposition and fabrication are applicable to any of the devices illustrated at FIGS. 1 to 9. The expression "device stack" as used in this document is intended to refer to the one or more thin film layers that are built up to create a thin film element stack which will result in an operable device, be it a light absorbing or light emitting device.

Therefore referring to FIG. 11A, a substrate 10 is provided having a bottom electrode 12 deposited on the substrate 10. The bottom electrode 12 is patterned having a P1 patterning feature 24 formed through the bottom electrode 12 so as to create electrical isolation between neighbouring bottom electrodes 12 by exposing the underlying substrate 10.

Figure 11B:
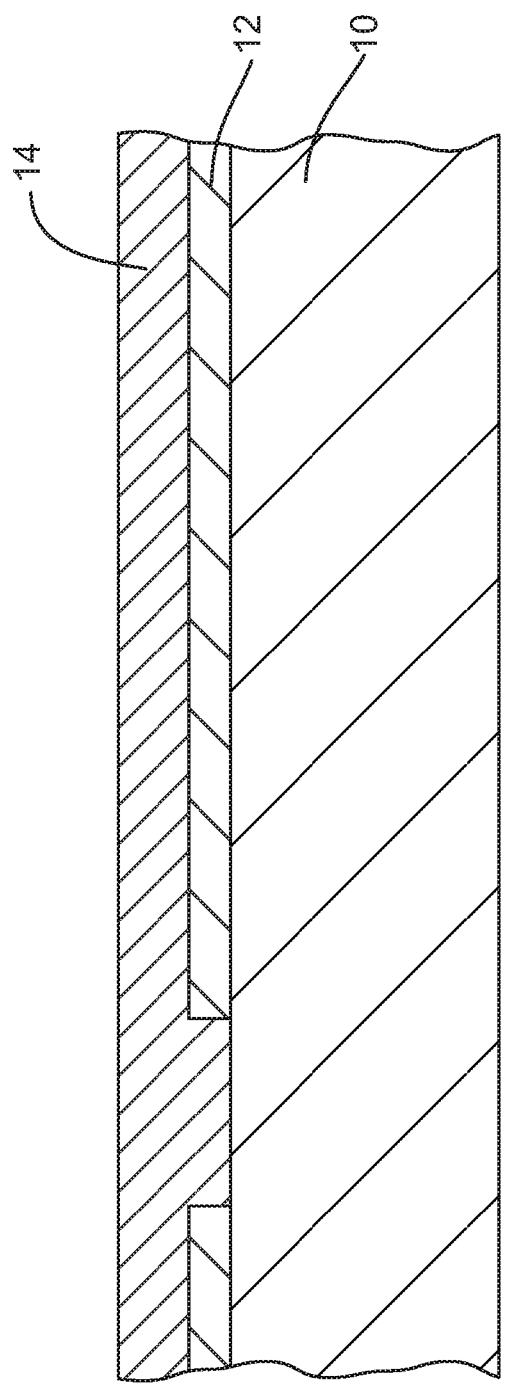
Figure 11C:
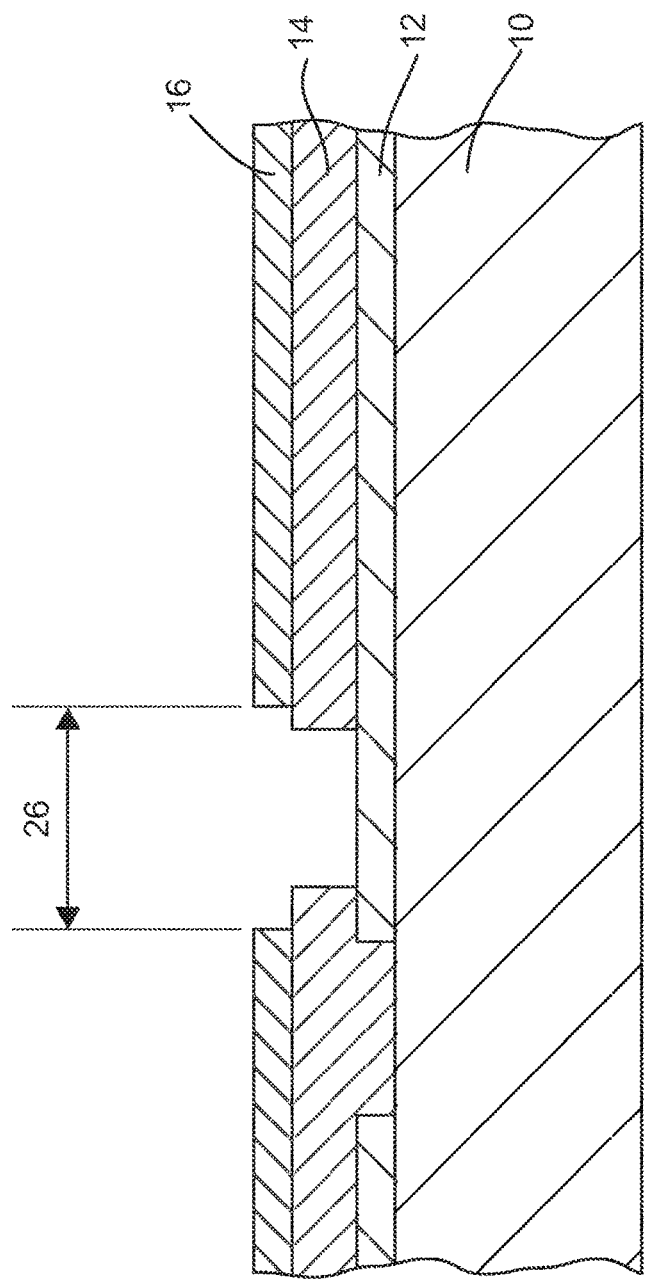

FIG. 11B shows the patterned bottom electrode 12 having an active layer 14 deposited over the patterned bottom electrode 12 and exposed substrate 10. Although the active layer 14 is shown as a single layer 14 it may comprise a stack of layers as described above in connection with FIG. 1. Turning to FIG. 11C, the patterned bottom electrode 12 on the substrate 10 is coated by the active layer 14, which in turn comprises an interface layer 16. The interface layer 16 comprises a hole collection compound such as poly(3,4-ethylenedioxythiophene)-poly(styrene sulfonate) ((PEDOT)-PSS) or polyaniline-poly(styrene sulfonate) (Pani). Alternative hole collection compounds include metal oxides such as MoO3, NiO, or V2O5.

Figure 11D:
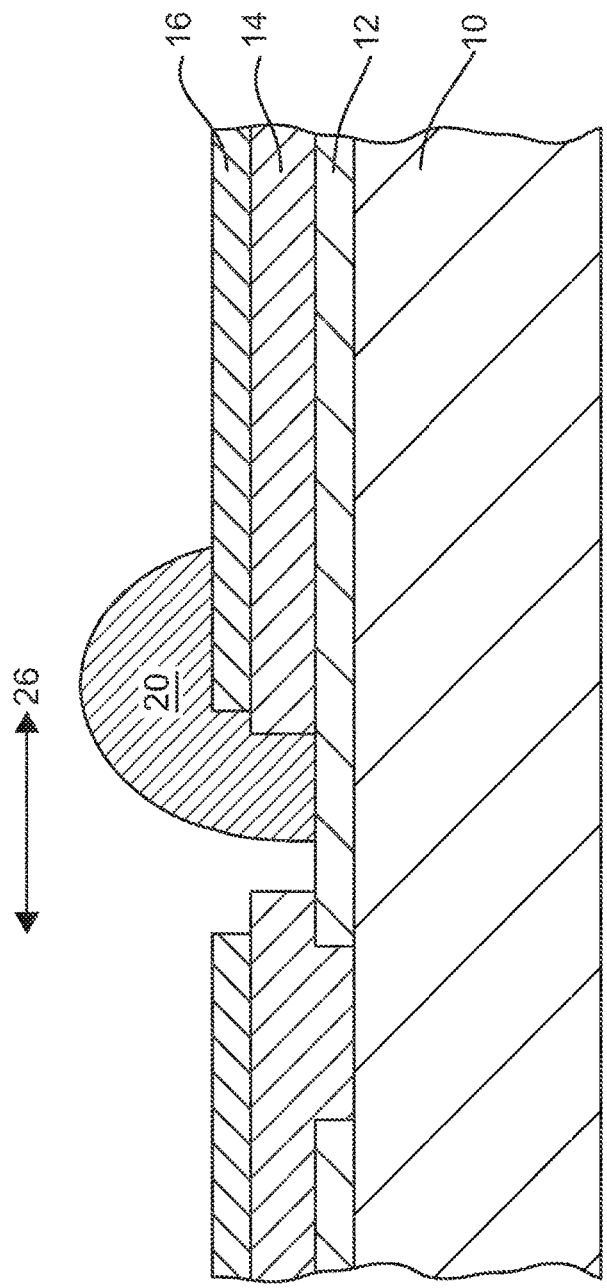

With reference to FIG. 11C, a second P2 patterning feature 26 is created in contact with the bottom electrode 12 and covering a portion of the photoactive layer 14 and interface layer 16. FIG. 11D illustrates a spacer structure 20 deposited partially within the second P2 patterning feature 26 on and in contact with the bottom electrode 12 and covering a portion of the photoactive layer 14 and interface layer 16. As discussed above in connection with FIG. 1, the spacer structure 20 may be a dielectric material although other materials may also be used alone or in combination with the dielectric.

Figure 11E:
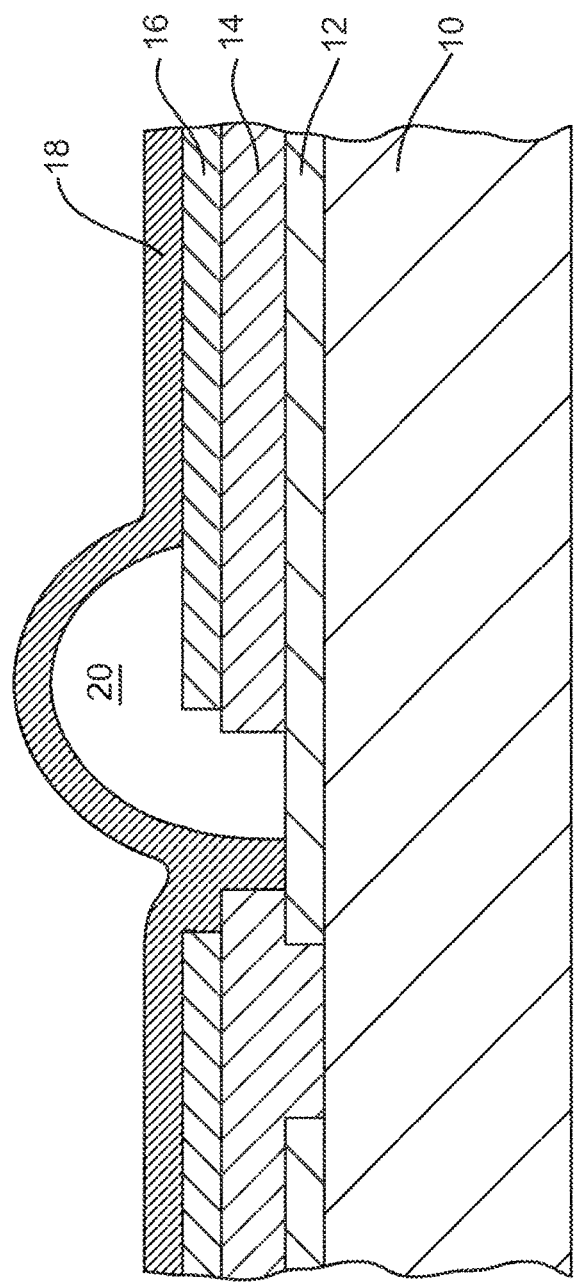
Figure 11G:
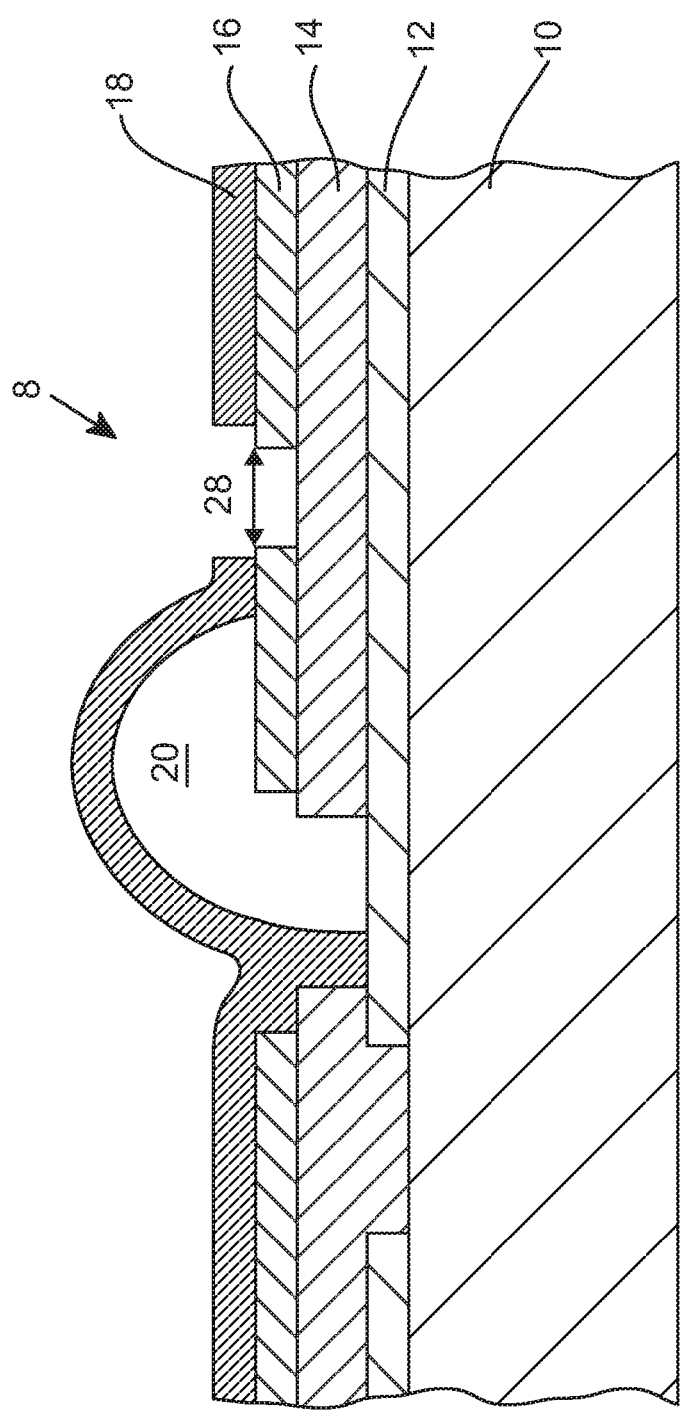

Referring to FIG. 11E an evaporated top metal electrode layer 18 is deposited over the spacer structure 20. In practical circumstances such a deposition process would happen at a site or equipment remote from the roll-to-roll apparatus used to build up the device stack requiring the web to be rolled-up for transportation. FIG. 11F illustrates a final patterned device stack with a third P3 patterning feature 28 providing a separation of the top electrode 18.

FIG. 12 shows an alternative embodiment in which the spacer material is capable of transmitting light. In this example, incident light 22 passes through the substrate 10 and other layers of the structure to be internally reflected off the reflective top electrode 18 back into the interface layer 16 and photoactive layer 14. In some cases, the top interface layer provides a level of sheet conductivity sufficient that electric current that is generated in the photoactive region covered by the spacer structure 20 will contribute to the overall current generated by the cell. Additionally, a fraction of incident light that impinges onto the area of the spacer structure 20 outside the region of the photoactive layer 14 will be reflected back onto the photoactive region 14 and therefore contributes to the photocurrent. As a result, the effective area for light collection is increased. The optical properties of the spacer material 20 are chosen such that it shows a high transmission in the active spectral range of the photoactive material of the solar cell. The incorporation of fluorescent dyes in the spacer material can additionally facilitate the trapping of light in these structures and down-shifting it to lower wavelengths more likely to be absorbed in adjacent cell elements and subsequently converted to electrical energy. With the incorporation of fluoropolymers a spacer structure 20 having low adhesion to roller surfaces can be provided. The top electrode 18 is deposited on and in contact with the spacer structure 20.

Examples of suitable spacer materials are:
Hotmelt adhesives
Doming compounds
Dielectric materials
UV cure dielectric materials such as
Dupont 5018™

Conductive materials: Dupont PV412™ screen printing paste.

The spacer materials can be deposited via inkjet, valvejet, dispensing nozzle, rotary screen and other deposition techniques known in the art, such as ToneJet™, electrophotographic printing and others where deposition is in the range of thickness required for a particular substrate, and the material properties and feature spacing are appropriate.

Referring to FIG. 13, and in an attempt to provide some realistic reference of scale between the spacer structure 20 and device stack, a spacer structure 20 with a height of around 10 um is shown deposited partially within the zone of interconnection patterning features, which provides a gap in the form of P1 patterning feature 24, and an exposed space on the bottom electrode 12 as a result of the P2 patterning feature 26. The P2 patterning feature 26 can be 1-500 um, and in this example is around 25 um. The device stack is no more than around 1 micron in height (Arrow 1) (so figure is still not quite to scale). As can be readily seen FIG. 13, the spacer structure 20 dwarfs the device stack and is coated by a top electrode 18 prior to post electrode patterning of the P3 patterning feature 28, a potential position of which is indicated by the downward facing arrow and which would provide the required break in the top electrode 18 between adjacent cells. In this case the spacer structure 20 also provides a means to avoid shorting of the top electrode 18 to the bottom electrode 12 on the left hand side device stack during top electrode deposition.

Referring to FIG. 14, a spacer structure 20 of dimension of around 20 microns (solid line) height and over 50 microns (dashed line) is illustrated as an example closer to the true relative scale between the spacer structure 20 and device stack. The spacer structure 20 of FIG. 14 is shown deposited partially within the zone of interconnection comprising the P1 and P2 patterning features 24 and 26, which provides a gap in, and an exposed space on, the bottom electrode 12. The P2 patterning feature 26 extends greater than 25 microns and the device stack is usually less than 1 micron in height with 300-500 nanometers being typical. The distance between active regions (2) of the adjacent device stacks depicted in FIG. 14 is greater than 75 microns, although narrower feature spacings and gaps are possible, depending on patterning techniques employed.

The main purpose of the spacer structure is to prevent the occurrence of damage to films which are deposited on top of a substrate material. In a first example, the spacer structure is not covered by the first electrode. This can be achieved by depositing the spacer structure above the first electrode, as shown in FIG. 15a or partially or fully beside the electrode (deposition into a gap created in the first electrode) as shown in FIG. 15B. In an alternative example where advantageously the spacer is covered by the first electrode, a portion of the first electrode covering the spacer structure must either not be in electrical contact with the main first (bottom) electrode predominantly covering the substrate or not be in electrical contact with the main planar region of the second (top) electrode. This is necessary in order to avoid a short circuit being created between the first electrode and the top electrode by them being in direct contact. This can be achieved by e.g. shadowing effects during layer electrode deposition or subsequent subtractive patterning of the top electrode for instance.

A number of thin film layers can be present between the substrate and the spacer structure 20 as shown in FIG. 16A. The preferred positioning depends on the robustness of the layers in the specific process, the process sequence and any interruption by re- and unwinding the web and the adhesion of the spacer structure and the thin film stack.

FIG. 16B shows an example in which the thin film coatings are interrupted and the spacer structure is directly anchored to the first electrode. In this case it is important that the spacer structure 21 covers the initially exposed bottom electrode. In FIG. 16C, the spacer structure 21 is deposited on the bottom electrode prior to coating of the thin film. This might have the drawback of thickness variations in the thin film coatings, however, a partial removal of the layers in the area of the spacer structure does not result in the creation of an electrical shunt after the deposition of a top electrode. If the adhesion allows, the spacer structure 21 could be deposited on any layer above the bottom electrode and below the top electrode. This is depicted in FIG. 16D. The deposition of the spacer structure out-side the zone of interconnection is shown in FIG. 16E. The drawback is a reduction in the size of the active area.

For instances of parallel interconnection, the partial removal of one or more coated layers in the zone of deposition of the spacer structure is also feasible, as shown in FIG. 17. The spacer structure 20 is formed by the combination of conducting feature 19 and dielectric cover 21. The ratio in height of the dielectric part and the conductive part of the spacer structure can vary. FIG. 18 demonstrates how, in this implementation, the conductor makes the main contribution to the height of the spacer structure, whereas the purpose of the relatively thin dielectric covering layer 21 in this case is to provide electrical isolation.

A number of thin film layers can partially or fully cover the spacer structure 20 and other layers in the thin film stack. In principle the entire stack comprising the interface layers 16, photoactive (or recombination) layer(s) 14, metal layers 18 except for the bottom electrode could be positioned over the spacer structure 20, as shown in FIG. 19. A disadvantage of this configuration can arise from an uneven thickness distribution of layers where they are coated from a solution caused by the surface effects induced by the spacer structure.

Thin film layers deposited by vacuum or atmospheric vapour processing (e.g. spatial ALD (Atomic Layer Deposition), CVD) are less affected. A preferred implementation is therefore one where the spacer structure is applied after the final solution processed device stack layer.

FIG. 20 shows a general positioning of the spacer structure 20 for parallel interconnection. The conductor 19 is in contact with the bottom electrode 12. The spacer element 20 can be located in any vertical position of the thin film stack. The most suitable position is determined by layer adhesion and processing conditions in a roll-to-roll process. A preferred configuration is one in which only the final top electrode (optionally including interface layer or layers 16 and comprising different combinations of metals) covers the spacer structure and the thin film stack.

The spacer structures preferably comprise dielectric or charge conducting structures primarily located in the so-called zone of electrical interconnection between two neighbouring thin film element stacks, the thin film element stacks which may also be referred to as cell elements. An example based on a conductive spacer structure 20 is shown in FIG. 21. In this case the series interconnection of adjacent cell elements is facilitated by the conductive spacer element, made predominantly from a conductive material such as for instance carbon black or a metal loaded paste.

The creation of channels is not always required, particularly if the adhesion of the spacer structure to the coated thin films is sufficiently strong. An example is shown in FIG. 22.

The dielectric spacer structure 20 is deposited on top of layers of the thin film system 14 and 16. It is also coated by the top injection layer 16. This structure can be advantageous when considering the processing sequence providing that the adhesion of the spacer to the underlying thin films is sufficient, and that the homogeneity of the top interface layer can be suitably maintained, for instance if it is deposited by a vacuum process.

Referring to FIG. 23, a spacer structure 20 is located on the side of the substrate 10 not having any thin film coating or device stacks and opposing the zone of electrical interconnection 30. The spacer element does not need to cover the surface of the substrate over the whole region forming the zone of interconnection, as indicated in FIG. 23. The cross sectional illustration shows a cut is carried out in cross-web direction of a roll-to-roll fabricated solar module. The purpose of the spacer structures is to protect the active regions of the thin film device when the web is rolled up. By locating the spacer structures 20 placed on the non-coated surface of the substrate so that they engage in the zone of interconnection, on the surface which has the thin film coatings, it is possible to avoid or at least reduce defects in areas critical for electrical shunts. FIG. 24 shows a cross section through a section of a rolled-up web.

In one example of the present invention the spacer structure is not covered by the bottom electrode. This can be achieved firstly by depositing the spacer element after the deposition of the bottom electrode and secondly that it is deposited prior to the deposition of the final top electrode. Prior to deposition of the spacer structure, the thin film element stack may comprise a deposited top interface layer. Such a preferred interface layer is PEDOT:PSS. Other examples of interface layers are WoOx, MoOx, NiOx, ZnO, TiOx. Alternatively also the interface layer can be deposited by vacuum deposition, followed by vacuum deposition of the metal electrode.

The presence of spacer structures should be as unobtrusive as possible and ideally should not compromise the performance and area utilization of the device. Therefore the spacer structures are preferably incorporated in the zone of the electrical interconnection between two neighbouring cell elements. The zone in between two P1 and P3 zones of a cell interconnection does not generally contribute in a significant way to the generation of electrical current in a photovoltaic cell or the emission of light in a light emitting device and can be considered to be redundant space. Hence, this area is used for the integration of the spacer structure. The zones P1 and P2 provide in particular surface interfaces with good adhesion for the spacer structure. The spacer structure can fully or partially cover the P1 or P2 features or zones and also adjacent areas (P3).

As will be appreciated by a person skilled in the art, the preferred height range of the spacer structure is a function of the line pitch and the flexibility of the substrate although a spacer structure of height in excess of 100 microns will suffice in many situations.

Accordingly, a photovoltaic module comprised of a plurality of series connected photovoltaic cells disposed upon a substrate is fabricated utilizing thin film device techniques. A substrate having at least a bottom electrode layer, a body of photovoltaic material, and a top electrode layer supported thereupon is patterned so as to define a number of individual, spatially separated photovoltaic cells and a number of similarly spatially separated connection zones. The connection zones are patterned to each include a portion of the bottom electrode material and are configured so that the bottom electrode material in each segment of the connection zone is exposed, and is in electrical communication with the bottom electrode portion of a particular cell. The top electrode of each cell is placed in electrical communication with the bottom electrode of an adjoining cell via the electrode layer in an appropriate connection zone. In this manner, a series interconnection between the cells is established. Electrical terminals may be affixed to the module, and the finished module may be encapsulated in a body of protective materials.

Example 1; The effect on the production yield of organic photovoltaic cells caused by contact of coated films with rollers and during wind-up was investigated experimentally. Using a combination of roll to roll and sheetfed processes a series of organic photovoltaic cells were fabricated consisting of a 125 um substrate carrying a transparent electrode followed by an interface layer, a photoactive layer, a PEDOT:PSS interface layer. To complete the devices a metal electrode was deposited by thermal evaporation. After each coating step on the Roll-to-Roll machine, a sample was taken and the fabrication was continued by manual sheet coating process steps where face side contact was avoided. This enabled separate evaluation of process steps that experienced face side contact (roll to roll deposited) and those that experienced no face side contact steps (by sheet fed). The yield in this experiment was defined by the percentage of devices with a power conversion above 0.3% (approx. 1.5 $cm^2$ test cell area). A yield above 95% was measured for the coating and unwinding of the first interface layer followed by the photoactive layer. The yield dropped to 58% after coating and rewinding the PEDOT:PSS interface layer. A further drop down to 25% was observed after repetitive un- and re-winding. This experiment proved that in particular the final PEDOT:PSS interface layer is prone to defects during face side contact with roller surfaces and during wind-up.

Example 2; The protective effect of the spacer structures of the present invention was investigated in an experimental set-up using a machine roller accurately mimicking transport of the web with the coated layers facing towards the roller surface. Test coating stacks prepared using the same materials as example 1 above containing 1.5 cm2 OPV test cells, some of which had 125 um high protective features applied, formed from a UV cure dielectric material (Dupont 5018A), which was deposited in the area of interconnection using a dispensing nozzle and cured with UV lamp, after PEDOT: PSS deposition, were prepared. The samples were mounted on a representative coating machine roller and repetitively rolled over the roller several hundred times, applying 200 N/m web tension, prior to top electrode deposition. The experiments (roller testing) were carried out with sample structures according to FIG. 1. The samples subsequently had a metal (silver) electrode applied by thermal evaporation and were measured using a solar simulator and an IV measurement set-up was used to extract solar cell parameters, enabling solar cell efficiency measurement at 100 mJ/cm2. The outcome of this test is that no significant change of the solar cell performance could be observed after the roller-testing. In both cases, pre- and post-roller testing, electrical fill-factors (of the current-voltage curve) above 50% were achieved which gives an indication of a low parasitic current flowing through electrical shunts. A 100% yield was measured for devices which had protective structures (spacers) applied, and no surface damage was observed. Comparison test devices which did not have the spacer structures applied showed substantial surface damage and had fill factors below 40% and correspondingly low yield (less than 50%).

It will be appreciated that although only one particular embodiment of the invention has been described in detail, various modifications and improvements can be made by a person skilled in the art without departing from the scope of the present invention.

Paragraphs of Invention

A substrate material extending in an X-Y plane and coated with a first electrode layer and further coated with one or more thin films to form a thin film device stack; the thin film device stack extending from the X-Y plane in a Z direction perpendicular to the X-Y plane to a distance T; at least one spacer element extending from the X-Y plane in a Z direction, the spacer element extending either directly from the substrate surface or being deposited on the first electrode layer or any of the thin films forming the thin film device stack; the spacer element, where present, extending in a Z direction to a distance S from the X-Y plane, the distance S being greater than the distance T.

A substrate material according to paragraph 1 in which the substrate material has a plurality of discrete thin film device stacks; the thin film device stacks having a zone of electrical interconnection between neighbouring thin film device stacks, and where the spacer element is located at least partially in the zone of electrical interconnection.

A substrate material according to paragraph 1 or 2, further having a top electrode deposited on top of the thin film device stack; the thin film stacks are arranged to be electrically series connected and the zone of electrical interconnection comprises a region for depositing a conductive material for providing an interconnection between top and first electrodes of neighbouring thin film stacks A substrate material according to paragraph 1 or 2 or 3, wherein the zone of electrical interconnection is provided by one or more of patterning features P1, P2 and P3; wherein P1 provides an electrical separation of a first electrode between neighbouring thin film device stacks, P2 provides a region for electrical interconnection between a top and first electrode of neighbouring thin film stacks, and P3 provides an electrical separation of the top electrode.

A substrate material according to paragraph 4, wherein the zone of interconnection is defined as the outer boundary of the P1 and P3 patterning features.

A substrate material according to any one of the preceding paragraphs, wherein the spacer structure, where present, is located over a portion of the first electrode and under a portion of the top electrode.

A substrate material according to any preceding paragraph, wherein two structures, each formed of different materials are deposited in the zone of interconnection, one of said structures being a spacer element.

A substrate material according to paragraph 7 in which one of the structures comprises a liquid, a grease or a wax.

A substrate material according to paragraph 1 or 2, wherein the thin film stacks are arranged to be parallel connected and the zone of electrical interconnection comprises a gap between neighbouring thin film stacks for receiving therein a current conducting spacer element which forms an interconnection between a first electrode and an output terminal.

A substrate material according to paragraph 9, wherein the zone of electrical interconnection is defined as the interface area between the conducting material and a transparent electrode.

A substrate material according to paragraph 9 or 10, wherein the conducting material is a conductive grid line or bus bar.

A substrate material according to any of paragraphs 9 to 11, wherein the spacer element is deposited on the first electrode.

A substrate material according to any of paragraphs 9 to 12, wherein the spacer element is deposited over at least a part of the conducting material.

A substrate material according to paragraph 13, wherein the spacer element is located between thin films and in an inactive region of a thin film device stack.

A substrate material according to paragraph 13, wherein the spacer element is deposited on the conducting material and thin film layers in at least a part of an inactive region of the thin film stack.

A substrate material according to any preceding paragraph, wherein the thin film stacks are continuous in-line stripes.

A substrate material according to paragraph 16, wherein the spacer element is deposited in a patterning feature adjacent neighbouring stripes.

A substrate material according to any of paragraphs 1 to 7 or 9 to 17, wherein the spacer element is deposited as a continuous bead of material.

A substrate material according to any one of paragraphs 9 to 12, 14, 17 or 18, in which the spacer element is a current conducting material.

A substrate material according to paragraph 16 or 17, wherein the spacer element is deposited in discrete units or as an intermittent bead of material.

A substrate material according to any preceding paragraph, wherein a plurality of thin film device stacks form a solar module and the deposition of the spacer element extends substantially along the length of the solar module A substrate material according to any preceding paragraph, wherein the thin film device stacks comprise a photoactive layer.

A substrate material according to paragraph 22, wherein the thin film device stacks are photovoltaic cells.

A substrate material according to any preceding paragraph, wherein the thin film device stack has a top electrode vacuum deposited over the spacer element.

A substrate material according to paragraph 24, wherein the top electrode is a metal electrode.

A substrate material according to any preceding paragraph, wherein the spacer element has a thickness in the Z direction of greater than 1 micrometer or preferably in the range from 1 micrometer to 500 micrometers; more preferably in the range between 10 micrometers to 300 micrometers; even more preferably in the range from 25 micrometers to 150 micrometers.

A substrate material according to any preceding paragraph, wherein the thin film device stack has a thickness in the Z direction of 50 nanometers up to 5 micrometers, preferably 150 nanometers to 3 micrometers, more preferably 300 nanometers to 1.5 micrometers.

A substrate material according to any preceding paragraph, wherein the zone of interconnection is a 3-dimensional zone extending in an X-Y plane over the substrate and extending in a Z direction away from the substrate.

An electronic thin film device formed from a coated substrate material according to any preceding paragraph.

An electronic thin film device according to paragraph 29, wherein the device is a solar module.

A method of fabricating a thin film electronic device in a roll-to-roll process, the method comprising providing a substrate; depositing one or more thin film layers to create one or more thin film device stacks on the substrate; providing a zone of electrical interconnection between thin film device stacks; and depositing a spacer element at least partially in the zone of electrical interconnection between thin film device stacks.

A substrate material extending in an X-Y plane coated on a first surface with one or more films to form a thin film device stack, having thickness T and extending in a Z direction perpendicular to and away from the X-Y plane, a second surface having on it at least one spacer element, the spacer element extending in a Z direction perpendicular to and away from the X-Y plane to a distance S greater than the distance T, the spacer element being positioned on the substrate such that when the substrate material is rolled onto a roll, the spacer element engages with a zone of interconnection formed between the thin film layers on the first surface.

A substrate material according to paragraph 32 and having a plurality of spacer elements in a pattern to engage with the inactive regions in the thin film stacks.

A substrate material according to any preceding paragraph in which the substrate is flexible.

A substrate material according to paragraph 34 in which the substrate can be rolled onto a roll.

The invention claimed is:

1. A web comprising a flexible substrate material having opposed front and back sides and extending in an X-Y plane, the front side being provided with a first electrode layer and further provided with at least one thin film to form a plurality of thin film device stacks, the flexible substrate material being flexible to enable the web to be rolled-up during transport of the web;

the thin film device stacks each comprising an electrically active region, the thin film device stacks being continuous in-line stripes wherein neighbouring pairs of the thin film device stacks have a zone of electrical interconnection therebetween that contains a first electrode formed by the first electrode layer;

each of the thin film device stacks extending from the X-Y plane in a Z direction perpendicular to the X-Y plane so that a neighbouring pair of the thin film device stacks defines first outermost surface regions of the web at distances T from the front side of the flexible substrate material;

the substrate material having at least a first protective structure adhered thereto and located at least partially in a first zone of electrical interconnection of the zones of electrical interconnection that is between the neighbouring pair of the thin film device stacks, the first protective structure defining a second outermost surface region of the web within the first zone of electrical interconnection that extends in the Z direction a distance S from the front side of the flexible substrate material, the distance S being greater than the distances T to create a gap which prevents contact of the electrically active regions of the neighbouring pair of the thin film device stacks with the back side of the substrate material when the web is rolled-up and with a machine roller during transport of the web, wherein the first protective structure is deposited as a continuous bead of material or as an intermittent bead of material and is applied to at least one of the front and back sides, the first electrode layer and the at least one thin film; and the ratio of the distance S to each of the distances T is at least 10:1.

2. The web as claimed in claim 1, further having a top electrode deposited on top of the thin film device stacks; wherein the thin film device stacks are arranged to be electrically series connected and each zone of electrical interconnection comprises a region for depositing a conductive material for providing an interconnection between the top electrode of a first thin film device stack of the thin film device stacks and the first electrode of a neighbouring thin film device stack of the thin film device stacks.

3. The web as claimed in claim 1, wherein each zone of electrical interconnection is provided by one or more of patterning features P1, P2 and P3; wherein P1 provides an electrical separation of the first electrode between the neighbouring pairs of the thin film device stacks, P2 provides a region for electrical interconnection between a top electrode and the first electrode of the neighbouring pairs of the thin film device stacks, and P3 provides an electrical separation of the top electrode.

4. The web as claimed in claim 3, wherein the zone of interconnection is defined as the area between the outer boundaries of the P1 and P3 patterning features.

5. The web as claimed in claim 2, wherein the first protective structure is located over a portion of the first electrode and under a portion of the top electrode.

6. The web as claimed in claim 1, wherein the first protective structure comprises two protective structures, each formed of different materials, that are deposited in the first zone of electrical interconnection.

7. The web as claimed in claim 1, wherein the thin film device stacks are arranged to be electrically parallel connected and each zone of electrical interconnection comprises a gap between the neighbouring pairs of the thin film device stacks and at least some of the zones of electrical interconnection contain a current conducting material that forms an interconnection between the first electrodes and an output terminal.

8. The web as claimed in claim 7, wherein the first zone of electrical interconnection is defined as the interface area between the current conducting material and the first electrode.

9. The web as claimed in claim 1, wherein the first protective structure is deposited as a continuous bead of material.

10. The web as claimed in claim 7, wherein the first protective structure is formed from a current conducting material.

11. The web as claimed in claim 1, wherein the thin film device stacks form a solar module and the deposition of the first protective structure extends substantially along the length of the solar module.

12. The web as claimed in claim 1, wherein the electrically active region of at least one of the thin film device stacks comprises a photoactive layer.

13. The web as claimed in claim 12, wherein the at least one thin film device stack is a photovoltaic cell.

14. The web as claimed in claim 1, wherein at least one of the thin film device stacks has a top electrode vacuum deposited over the first protective structure.

* * * * *